(12) United States Patent
Kim

(10) Patent No.: US 8,199,581 B2
(45) Date of Patent: Jun. 12, 2012

(54) NONVOLATILE MEMORY DEVICE, DRIVING METHOD THEREOF, AND MEMORY SYSTEM HAVING THE SAME

(75) Inventor: Moosung Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 297 days.

(21) Appl. No.: 12/712,813

(22) Filed: Feb. 25, 2010

(65) Prior Publication Data

US 2011/0051520 A1    Mar. 3, 2011

(30) Foreign Application Priority Data

Aug. 31, 2009 (KR) .................. 10-2009-0081130

(51) Int. Cl.
*G11C 16/06* (2006.01)
*G11C 16/08* (2006.01)
*G11C 16/30* (2006.01)

(52) U.S. Cl. .............. 365/185.18; 365/226; 365/185.17; 365/185.27; 365/185.23; 365/189.09

(58) Field of Classification Search ............. 365/185.18, 365/226, 185.17, 185.27, 185.23, 189.09, 365/189.11, 185.19, 185.11, 185.05, 185.22
See application file for complete search history.

(56) References Cited

U.S. PATENT DOCUMENTS 7,463,525 B2    12/2008    Zheng et al.
2010/0008165 A1*    1/2010    Macerola et al. ........ 365/189.15

FOREIGN PATENT DOCUMENTS

KR    1020010061476    7/2001
KR    1020090048102    5/2009

* cited by examiner

*Primary Examiner* — J. H. Hur
(74) *Attorney, Agent, or Firm* — F.Chau & Associates, LLC

(57) ABSTRACT

A nonvolatile memory device (NVM), memory system and apparatus include control logic configured to perform a method of applying negative voltage on a selected wordline of the NVM. During a first time a first high voltage level is applied to the channel of a transistor of a address decoder and a ground voltage is applied to the well of the transistor. And, during a second time a second high voltage level is applied to the channel of the transistor, and within the second time interval a first negative voltage is applied to the well of the transistor. The first high voltage level is higher than the second high voltage level, and a voltage applied on the selected wordline is negative within the second time interval.

23 Claims, 26 Drawing Sheets

NONVOLATILE MEMORY DEVICE, DRIVING METHOD THEREOF, AND MEMORY SYSTEM HAVING THE SAME

CROSS-REFERENCE TO RELATED APPLICATIONS

This U.S. non-provisional patent application claims priority, under 35 U.S.C. §119, of Korean Patent Application No. 10-2009-0081130, filed on Aug. 31, 2009, the entire contents of which are hereby incorporated by reference.

BACKGROUND

1. Field of the Invention

The present invention relates to a nonvolatile memory device, a driving method thereof, and a memory system having the same.

2. Description of the Related Art

Semiconductor memory devices are microelectronic devices that are widely used in the design of digital logic circuits such as microprocessor-based applications and computers for products ranging from satellites to consumer electronics. Advances in memory fabrication technology, including technology development and process improvement obtained through scaling for high speed and high integration density, have raised the performance of digital logic systems.

Semiconductor memory devices are generally classified into volatile memory devices and nonvolatile memory devices. The nonvolatile memory devices can retain data even when power supply is disconnected. Data stored in the nonvolatile memory devices may be permanent (read only) or reprogrammable. The nonvolatile memory devices are now widely used to store executable programs or microcodes in various applications such as computers, avionics, communications, and consumer electronic technologies.

An example of the nonvolatile memory device is a flash memory device. Recently, as the demand for the high integration (miniaturization) of memory devices increases, multi-bit memory devices capable of storing multiple bits in each memory cell have become a standard commercial product.

SUMMARY OF THE INVENTION

Various embodiments of the invention provide a nonvolatile memory device (NVM), a memory system including the NVM and an apparatus including the NVM. The NVM includes control logic configured to perform a disclosed method of applying a negative voltage on a selected wordline of the NVM. In the NVM, during a first time (e.g., during a program period of an ISPP loop) a first high voltage level (e.g., a maximum supply voltage) is applied to the channel of a transistor of a address decoder and a ground voltage is applied to the well of the transistor. And, during a second time (e.g., during a verify period of the ISPP loop) a second high voltage level is applied to the channel of the transistor, and within the second time interval a first negative voltage is applied to the well of the transistor. The first high voltage level is higher than the second high voltage level, and a voltage applied on the selected wordline is negative within the second time interval.

The reliability of a nonvolatile memory device made or operated according to an exemplary embodiment of the invention can be improved.

A first aspect of the invention provides a method of applying negative voltage on a selected wordline of a nonvolatile memory device (NVM), comprising: during a first time interval applying a supply voltage at a first selected high level to the channel of a first transistor of a wordline selection circuit of the NVM, and during the first time interval applying a ground voltage to the well of the first transistor of the wordline selection circuit; during a second time interval applying a supply voltage at a second selected high level to the channel of the first transistor of the wordline selection circuit, and applying within the second time interval a first negative voltage to the well of the first transistor of the wordline selection circuit; and wherein the first selected high level is higher than the second selected high level, and wherein a voltage applied on the selected wordline is negative within the second time interval and not within the first time interval.

Another aspect of the invention provides a method of selecting a wordline in a nonvolatile memory (NVM) device, comprising: during a first time interval applying a supply voltage at a first high level to the channel of a first transistor of a selection circuit of the NVM configured to select the wordline, and during the first time interval applying a ground voltage to the substrate of the first transistor; during a second time interval applying a supply voltage at a first lower high level to the channel of the first transistor, and applying within the second time interval a first negative voltage to the well of the first transistor; and wherein the first lower high level is lower than the maximum high level, and wherein a wordline voltage applied on the selected wordline is negative within the second time interval and not within the first time interval.

Another aspect of the invention provides a method for driving a nonvolatile memory device, comprising: generating a supply voltage and applying the supply voltage to a first transistor of a memory block selector in an address decoder; passing a received word line voltage through the memory block selector to a selected word line selected based on address information; and varying the supply voltage according to whether the received word line voltage passed to the selected word line is a negative voltage.

Another aspect of the invention provides a nonvolatile memory device comprising: a supply voltage generator generating a supply voltage; and an address decoder, including a first transistor receiving the supply voltage, passing received word line voltages to a plurality of word lines of a selected memory block, wherein the supply voltage according to whether a negative word line voltage is passed to at least one of the word lines. The nonvolatile memory device may further comprise a well voltage generator generating a well voltage to be applied to the well of the first transistor, wherein the well voltage varies according to whether a negative word line voltage is passed to at least one of the word lines of the selected memory block.

The address decoder comprises a plurality of memory block selectors, each memory block selector may include: a block word line controlling a memory block selection circuit configured to pass the word line voltages to word lines of a selected memory block; a pull-up circuit providing the supply voltage to the block word line in response to an enable signal; a pull-down circuit electrically disconnecting the block word line from the well of the first transistor in response to the enable signal and electrically connecting the block word line to the well of the first transistor in response to a complementary signal of the enable signal.

Another aspect of the invention provides an apparatus comprising a nonvolatile memory (NVM) device including: a memory cell array having a plurality of wordlines; an address decoder circuit including a wordline selection circuit configured to select a wordline of the memory cell array and to pass a negative wordline voltage to the selected wordline; a high voltage circuit configured to select one of a maximum high voltage and a first lower high voltage as the supply voltage of the selection circuit in the address decoder; a negative voltage circuit configured to select one of a ground voltage and a first negative voltage as the well voltage of a transistor in the selection circuit of the address decoder; and a control logic unit configured to perform a disclosed method by controlling the negative voltage circuit to select the well voltage, and controlling the high voltage circuit to select the supply voltage based upon whether a negative voltage is passed by the wordline selection circuit to the selected word line in a program operation, a read operation, a verify read operation, or an erase operation.

The apparatus may comprise: a plurality of memory blocks having a plurality of memory cells formed at the intersections of a plurality of word lines and a plurality of bit lines; an address decoder selecting one of the memory blocks in response to an input address and passing a word line voltage to a selected word line in the selected memory block corresponding to the input address; an input/output buffer temporarily storing data to be programmed in the memory cell array in a program operation, or temporarily storing data read from the memory cell array in a read operation; a voltage generator generating the word line voltage, the supply voltage, and a well voltage; and a control logic unit controlling the voltage generator to adjust the level of the supply voltage according to the level of the well voltage. The control logic unit controls the voltage generator to vary the level of the well voltage according to whether a negative voltage is passed to a word line of the selected memory block. The apparatus may further comprise a memory controller including a host-interface circuit that implements a standardized interface protocol selected from: Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), external SATA (eSATA), Small Computer Small Interface (SCSI), Enhanced Small Disk Interface (ESDI), and Integrated Drive Electronics (IDE).

The apparatus can be a computing system that further comprises: a central processing unit (CPU) connected to a system bus; a data storage device connected to the system bus and including the nonvolatile memory (NVM) device and the memory controller. The computing system can be a personal computer, a network file server, a cellular phone, a personal digital assistant (PDAs), a digital cameras, a camcorder, a portable audio player, or a portable media player.

Preferred embodiments of the invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION OF EXEMPLARY EMBODIMENTS OF THE INVENTION

Figure 1:
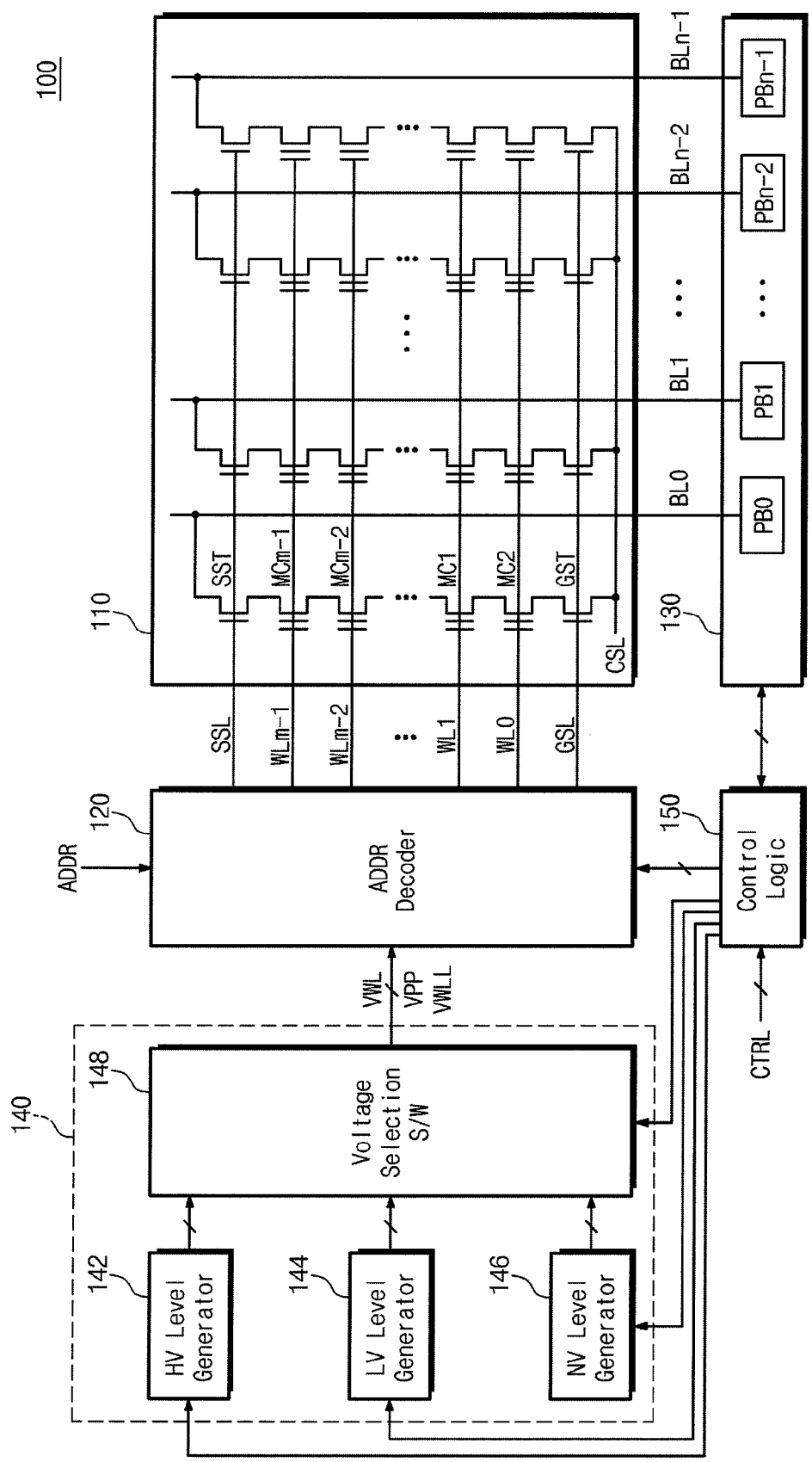
FIG. 1 is a block diagram of a nonvolatile memory device according to a first exemplary embodiment of the invention.

FIG. 1 is a block diagram of a nonvolatile memory device according to a first exemplary embodiment of the invention.

Referring to FIG. 1, a nonvolatile memory device 100 includes a memory cell array 110, an address decoder 120, an input/output (I/O) circuit 130, a voltage generator 140, and a control logic unit 150. The control logic unit 150 varies/adjusts/determines/controls/selects a high supply voltage VPP and/or a well voltage VWLL according to whether a negative voltage is applied to a wordline. The well voltage VWLL is provided to the well of transistors in the address decoder 120. The well voltage VWLL is preferably provided to the well of at least one transistor in the address decoder 120, e.g., as shown connected to the well(s) of driver transistor NHD0, and output transistors BS1, BS2, . . . BSm+2 in FIG. 16. The high supply voltage VPP is provided to at least one driver transistor in the address decoder 120 as shown connected to the driver transistor NHD1, and to output BS1, BS2, . . . BSm+2 in FIG. 16.

The exemplary nonvolatile memory device 100 shown in FIG. 1 is a NAND flash memory device, however the inventive concept is not limited to NAND flash memory devices. Examples of the nonvolatile memory device 100 include NOR flash memories, resistive random access memories (PRAMs), magnetoresistive random access memories (MRAMs), ferroelectric random access memories (FRAMs), and spin transfer torque random access memories (STT-RAMs). Also, the nonvolatile memory device 100 may be configured to have a three-dimensional array structure.

The memory cell array 110 includes a plurality of memory cells disposed at the intersections of the plurality of wordlines WL0~WLm−1 and the plurality of bit lines BL0~BLn−1. Herein, 'm' and 'n' are natural numbers. The memory cell array 110 includes a plurality of memory blocks. As an exemplary embodiment, one memory block is illustrated in FIG. 1. Each of the memory blocks includes a plurality of pages. Each of the pages includes a plurality of memory cells connected to a corresponding wordline. The nonvolatile memory device 100 performs an erase operation on a block-by-block basis, and performs a write or read operation on a page-by-page basis.

Each of the memory cells stores 1-bit data or data of two or more bits. The memory cell capable of storing 1-bit data is called a single level cell (SLC). The memory cell capable of storing data of two or more bits is called a multi level cell (MLC). The SLC has one erase state and one program state defined according to two threshold voltages. The MLC has one erase state and a plurality of program states defined according to a plurality of threshold voltages.

The memory cell array 110 is configured to have a cell string structure. Each cell string includes a string selection transistor SST connected to a string selection line SSL, a plurality of memory cells MC0~MCm−1 connected respectively to a plurality of wordlines WL0~WLm−1, and a ground selection transistor GST connected to a ground selection line GSL. Herein, the string selection transistor SST is connected between a bit line and a string channel (a semiconductor channel shared in series by all of the memory transistors in the strong), and the ground selection transistor GST is connected between the string channel and a common source line CSL.

The address decoder 120 is connected to the memory cell array 110 through the selection lines SSL and GSL and the wordlines WL0~WLm−1. In a program or read operation, the address decoder 120 receives an address ADDR and selects one of the memory blocks according to the received address ADDR. Also, the address decoder 120 selects the wordline (page) in the selected memory block according to the received address ADDR. The memory cells that are to be programmed or read are connected to the selected wordline.

Also, the address decoder 120 applies bias voltages (e.g., a program voltage, a pass voltage, a string selection voltage, and a ground selection voltage) for each program or read operation to the selected wordline, the unselected wordlines, and the selection lines SSL and GSL. Herein, the bias voltages are generated by the voltage generator 140 under the control of the control logic unit 150.

The I/O circuit 130 are connected through the bit lines BL0~BLn−1 to the memory cell array 110. The I/O circuit 130 includes a plurality of page buffers PB0~PBn−1. The page buffers PB0~PBn−1 temporarily store data that are to be programmed in the memory cells connected to the selected wordline, or temporarily store data that are read from the memory cells connected to the selected wordline.

In a program operation, a bit line program voltage (e.g., 0V) is applied to the bit lines connected to the program cells, and a bit line program inhibition voltage (e.g., a power supply voltage) is provided to the bit lines connected to the program-inhibited cells. The bit line program inhibition voltage is also called a bit line precharge voltage.

The voltage generator 140 generates voltages for driving the nonvolatile memory device 100 under the control of the control logic unit 150. The voltage generator 140 includes a high voltage (HV) level generator 142, a low voltage (LV) level generator 144, a negative voltage (NV) level generator 146, and a voltage selection switch (S/W) unit 148.

The high voltage level generator 142 generates high voltage levels for driving the nonvolatile memory device 100 under the control of the control logic unit 150. Herein, the high voltage levels are used as a program voltage and a pass voltage.

The low voltage level generator 144 generates low voltage levels for driving the nonvolatile memory device 100 under the control of the control logic unit 150. Herein, the low voltage levels are used as a read voltage and a read verify voltage.

The negative voltage level generator 146 generates negative voltage levels for driving the nonvolatile memory device 100 under the control of the control logic unit 150. Herein, the negative voltage levels are used as a wordline voltage VWL and a well voltage VWLL. Herein, the wordline voltage VWL will be a program voltage, a pass voltage, a read voltage, a read verify voltage, or an erase voltage.

The negative voltage level generator 146 is enabled or disabled according to whether a negative wordline voltage VWL is applied to at least one wordline. Thus, the negative voltage level generator 146 is preferably enabled only when a negative wordline voltage VWL is applied to at least one wordline; and the negative voltage level generator 146 is disabled when a negative wordline voltage VWL is not applied to at least one wordline. However, the invention is not limited thereto. Thus, the negative voltage level generator 146 may be enabled regardless of whether a negative wordline voltage VWL is applied to a wordline.

Under the control of the control logic unit 150, the voltage selection switch unit 148 selects the high voltage levels of the high voltage level generator 142, the low voltage levels of the low voltage level generator 144, and the negative voltage levels of the negative voltage level generator 146 as a wordline voltage VWL, as a high supply voltage VPP, and as a well voltage VWLL necessary for a driving operation, and provides the selected voltages to the address decoder 120.

The voltage selection switch unit 148 selects the negative voltage level as the well voltage VWLL (see FIG. 3) while selecting the negative voltage level as the wordline voltage VWL. Also, the voltage selection switch unit 148 selects the varied (reduced) level as the high supply voltage VPP when selecting the negative voltage level as the wordline voltage VWL. For example, the varied (reduced) level VPPL used as the high supply voltage VPP if (e.g., while) a negative level is selected as the wordline voltage VWL is lower than the nominal higher supply voltage VPPH used as the high supply voltage VPP when a nonnegative level is selected as the wordline voltage VWL (see FIG. 5 or FIG. 8).

The voltage selection switch unit 148 may select a default voltage (e.g., a ground voltage) as the well voltage VWLL when the negative voltage level is not applied as the wordline voltage VWL of the selected-wordline Sel.WL. However, in this exemplary embodiment, the voltage selection switch unit 148 selects the negative voltage level as the well voltage VWLL when (e.g., if, while) the negative voltage level is applied as the wordline voltage VWL of the selected-wordline Sel.WL. The negative voltage level of the wordline voltage VWL may be equal to or higher than the negative voltage level of the well voltage VWLL.

When the negative voltage level generator 146 is enabled, the negative voltage is provided to the well of transistors in the voltage selection switch unit 148. Thus, when the negative wordline voltage VWL is applied to at least one wordline (e.g., to the selected-wordline Sel.WL), the negative voltage is provided to the well of transistors in the voltage selection switch unit 148.

The control logic unit 150 controls the overall operation of the nonvolatile memory device 100 (e.g., the erase, program, read, and verify-read operations). The control logic unit 150 may perform each erase/program/read/verify-read operation according to control signals CTRL received from an external device.

The control logic unit 150 controls the address decoder 120, the I/O circuit 130, and the voltage generator 140 to perform a program operation according to an incremental step pulse program (ISPP) method.

The control logic unit 150 controls the high voltage level generator 142 to vary the high supply voltage VPP according to whether a negative voltage is applied to at least one wordline in a program operation, a read operation, a verify-read operation, or an erase operation.

Also, the control logic unit 150 controls the negative voltage level generator 146 to vary the well voltage VWLL according to whether a negative voltage is applied to at least one wordline during a program operation, a read operation, a verify-read operation, or an erase operation. In other words, the control logic unit 150 controls the voltage generator 140 to vary the high supply voltage VPP according to the well voltage VWLL.

The control logic unit 150 includes at least two modes for setting different well voltage levels in a plurality of verify-read operations. For example, the first mode is set to generate a well voltage with a (negative) first level until the completion of at least one of the verify-read operations and then to generate a well voltage with a (default, zero, ground) second well voltage. The second mode is set to generate a well voltage with a (negative) first level only in at least one of the verify-read operations and then to generate a (default, zero, ground) well voltage with a second level in the other periods. This two-mode setting may be selected by a user or by the control logic unit 150.

The nonvolatile memory device 100 varies the high supply voltage VPP or the well voltage VWLL according to whether a negative voltage is applied to at least one wordline.

The nonvolatile memory device 100 varies the well voltage VWLL when a negative voltage is applied to at least one wordline (e.g., to a selected wordline Sel.WL), thereby preventing a DC path from being created at a device (e.g., a transistor). For example, a typical driver transistor in the address decoder block 120 conventionally includes a P-type doped well and an N-type doped region connected to the wordline. Thus, when a negative voltage is applied to the wordline, (i.e., when a negative voltage is applied to the N-type doped region), a negative voltage is applied by the N-type doped region to the P-type doped well at a PN junction, thereby preventing a DC current path from being created between the P-type doped well and the N-type doped region.

Also, embodiments of the invention can prevent the PN junction breakdown of a device (e.g., a transistor) in the nonvolatile memory device 100 caused by a voltage difference between the well voltage VWLL and the high supply voltage VPP. For example, a voltage equal to the maximum high supply voltage VPP minus the well voltage VWLL is applied to a PN junction between the well and the doped region of the transistor to which the high supply voltage VPP is applied. The nonvolatile memory device 100 varies the high supply voltage VPP and the well voltage VWLL under the control of the control logic unit 150, thereby preventing the breakdown of a PN junction created between a well and a doped region of the device to which the high supply voltage VPP is applied.

Figure 2:
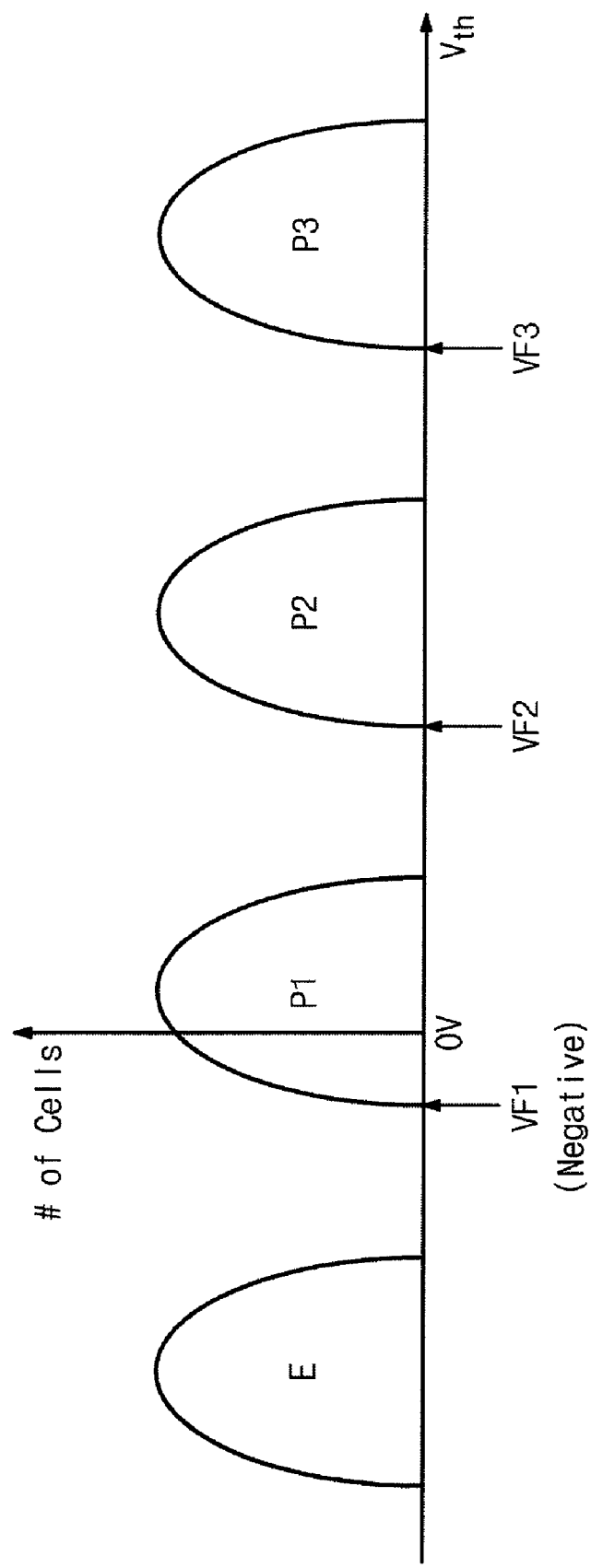
FIG. 2 is a graph of a threshold voltage distribution for a first program method of the nonvolatile memory device 100 of FIG. 1.

FIG. 2 is a graph of a threshold voltage distribution for a first program method of the nonvolatile memory device 100 of FIG. 1.

Referring to FIG. 2, each of the memory cells has four states E, P1, P2, and P3 for encoding two bits of information, and threshold voltage distribution ideally enables the in nonvolatile memory device 100 to reliably distinguish between each state.

Herein, the four states are an erase state E, a first program state P1, a second program state P2, and a third program state P3. A verify-read operation of a first verify level VF1 (hereinafter referred to as a first verify-read operation) is performed to determine whether the memory cell reaches the first program state P1. Herein, the first verify level VF1 has a negative voltage. A verify-read operation of a second verify level VF2 (hereinafter referred to as a second verify-read operation) is performed to determine whether the memory cell reaches the second program state P2. A verify-read operation of a third verify level VF3 (hereinafter referred to as a third verify-read operation) is performed to determine whether the memory cell reaches the third program state P3.

Figure 3:
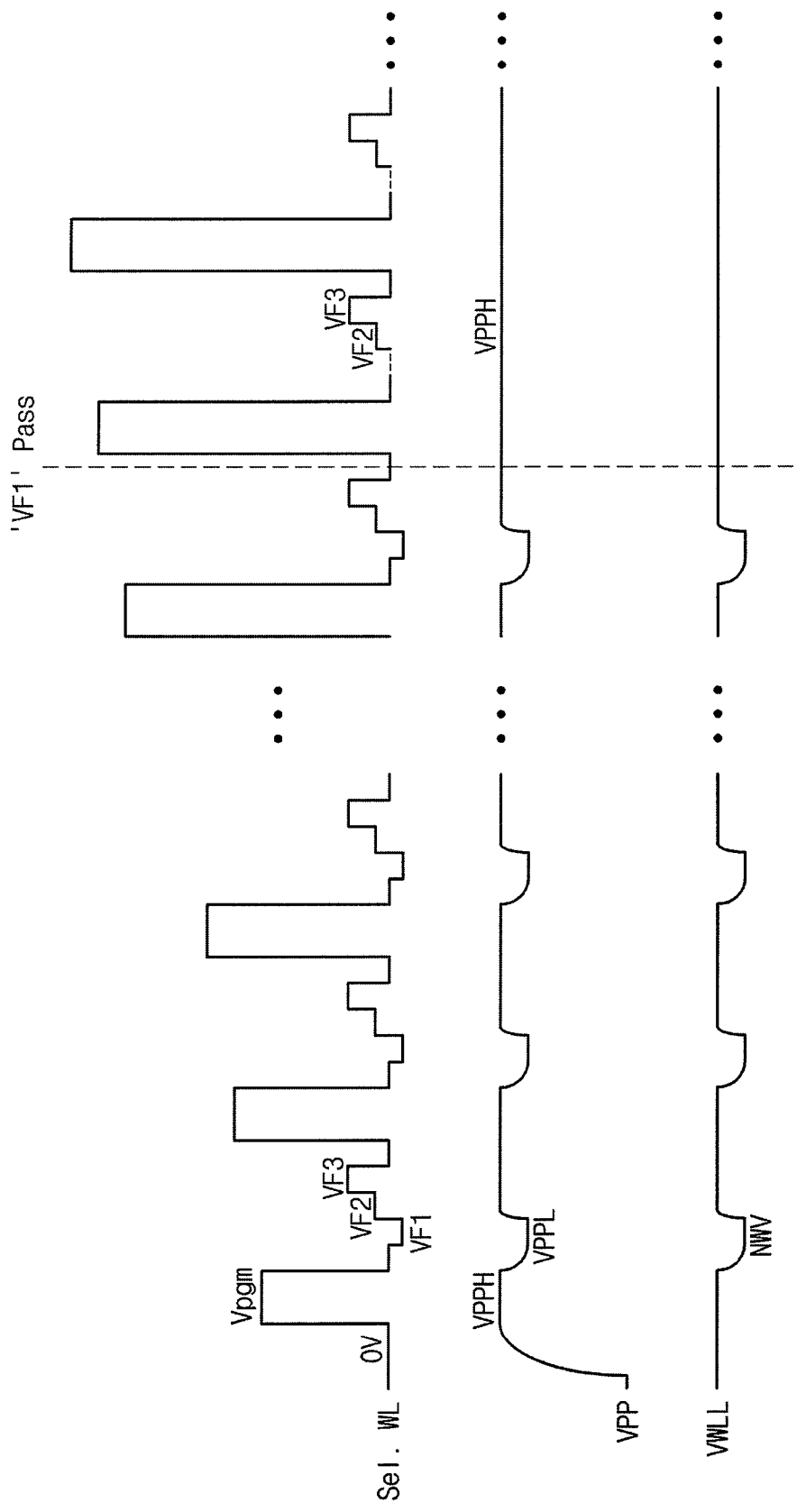
FIG. 3 is a time-voltage graph illustrating a first well voltage/high supply voltage control method in a program operation according to the threshold voltage distribution of FIG. 2.

FIG. 3 is a time-voltage graph illustrating a first well voltage/high supply voltage control method in a program operation according to the four-state threshold voltage distribution of FIG. 2.

Referring to FIG. 3, the nonvolatile memory device 100 performs a program operation according an incremental step pulse program (ISPP) method. In the ISPP method, a program voltage Vpgm applied to a selected wordline Sel.WL increases with an increase in a loop count.

When the program voltage Vpgm is applied to the selected wordline Sel.WL, the well voltage VWLL is 0V (default voltage, ground voltage) and the high supply voltage VPP has a (highest) first level VPPH. Thereafter, if in a first verify-read operation period, the well voltage VWLL has a negative level NWV then the high supply voltage VPP has a (lower) second level VPPL. Herein, the second level VPPL is lower than the first level VPPH. Thereafter, if in a second verify-read operation period, the well voltage VWLL is 0V then the high supply voltage VPP has the (highest) first level VPPH. Thereafter, if in a third verify-read operation period, the well voltage VWLL is 0V then the high supply voltage VPP has the (highest) first level VPPH.

If a fail is detected in at least one of the first to third verify-read operations, then in ISPP programming the program voltage Vpgm increased by a predetermined level is applied to the selected wordline Sel.WL.

When the memory cells targeting the first program state P1 are all programmed in the first verify-read operation period, then in a verify-read operation period of the next program loop the well voltage VWLL is 0V and the high supply voltage VPP has the (highest) first level VPPH. Thus, the well voltage VWLL with a negative level NWV and the high supply voltage VPP with a (lower) second level VPPL are provided only in the first verify-read period until the ISPP loop in which first verify-read operation passes.

Each of the page buffers PB0~PBn−1 (see FIG. 1) stores a bit value (e.g., '10') corresponding to the first program state P1 in the program operation in order to determine whether the memory cells targeting the first program stage P1 are all programmed. Then, in the first verify-read operation, only the page buffers storing the bit value corresponding to the first program state P1 output a pass bit (data '1') or a fail bit (data '0'). The other page buffers output a pass bit (data '1') in the first verify-read operation regardless of the program success. The pass or fail of the first verify-read operation is determined according to the fail bit outputted from each of the page buffers PB0~PBn−1.

If the first verify-read operation passes in any ISPP program loop, the first verify-read operation is not performed in the next program loop. The first verify-read period denoted by a dotted line may be or may not be included in the last ISPP program loops.

The second and third verify-read operations are performed in the same way as the first verify-read operation.

As described above, the well voltage VWLL is 0V in the periods other than the first verify-read period. However, the well voltage VWLL is not necessarily 0V in the periods other than the first verify-read period. In the periods other than the first verify-read period, the well voltage VWLL has a level higher than the negative level NWV.

The program operation according to an exemplary embodiment of the invention is not limited to the above method. In an alternative exemplary embodiment, the state of a threshold voltage in the program operation changes incrementally from the erase state E to the first program state P1, from the first program state P1 to the second program state P2, and from the second program state P2 to the third program state P3.

Figure 4:
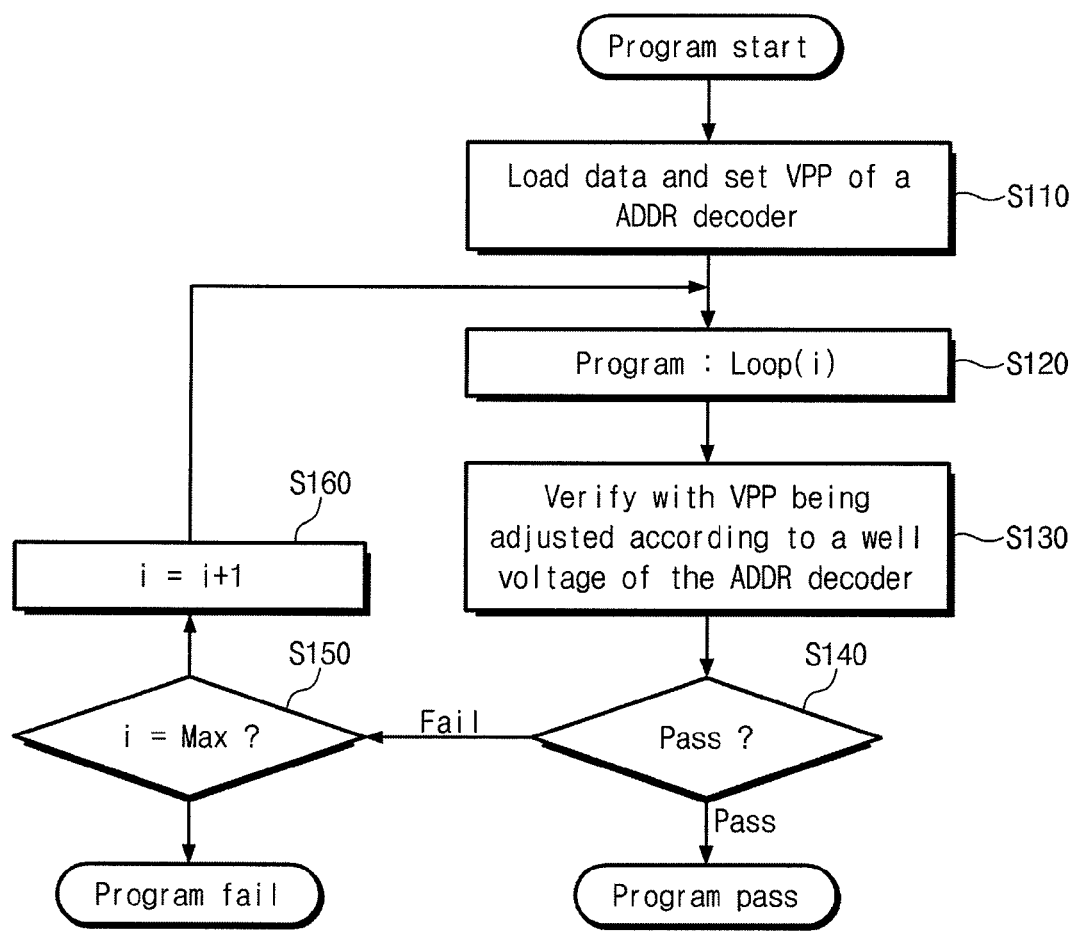
FIG. 4 is a flow chart of the first program method of the nonvolatile device 100 of FIG. 1.

FIG. 4 is a flow chart of the first program method of the nonvolatile method device 100 of FIG. 1.

Referring to FIGS. 1 to 4, the first program method of the nonvolatile memory device 100 proceeds as follows.

During a program operation, random program data are loaded into each of the page buffers PB0-PBn−1 of the I/O circuit 130 (see FIG. 1) (S110). Meanwhile, the voltage generator 140 (see FIG. 1) generates bias voltages for a program operation (e.g., a program voltage Vpgm, a pass voltage Vpass, a high supply voltage VPP, a well voltage VWLL, and a verify-read voltage) under the control of the control logic unit 150 (see FIG. 1). In particular, the well voltage VWLL has the default voltage level (0v, ground), and the high supply voltage VPP to be provided to the address decoder 120 (seed FIG. 1) has the (higher) first level VPPH.

The control logic unit 150 performs an ISPP program loop (i). The control logic unit 150 applies voltages on the bit lines BL0~BLn−1 according to the data loaded into the corresponding page buffers PB0~PBn−1. Thereafter, a pass voltage is applied to the unselected wordlines and a program voltage Vpgm is applied to the selected wordline Sel.WL (S120). The level of the program voltage Vpgm increases by a predetermined voltage increment with each increase in the ISPP loop count (i).

The pass voltage Vpass may be applied to the selected wordline for a predetermined time before the application of the program voltage Vpgm. Thereafter, a program recovery operation is performed. In the program recovery operation, the bias voltages applied to the string selection lines SSL and the wordlines WL0~WLm−1 are discharged, and the voltages applied to the bit lines BL0~BLn−1 are discharged.

Thereafter, the control logic unit 150 controls the voltage generator 140 (see FIG. 1) to generate the high supply voltage VPP adjusted to the well voltage VWLL of the transistors of the address decoder 120. For example, the control logic unit 150 controls the high voltage level generator 142 and the voltage selection switch unit 148 to select the (lower) second level VPPL as the high supply voltage VPP when the well voltage VWLL has the negative level NWV. The control of the high supply voltage VPP may be performed in synchronization with the completion of the program recovery operation or with the start of the verify-read operation.

The control logic unit 150 performs a first verify-read operation by applying a first verify level VF1 voltage to determine whether the memory cells targeting the first program state P1 are programmed successfully, then performs a second verify-read operation by applying a second verify level VF2 voltage to determine whether the memory cells targeting the second program state P2 are programmed successfully, and next performs a third verify-read operation by applying a third verify level VF3 voltage to determine whether the memory cells targeting the third program state P3 are programmed successfully (S130).

The first verify level VF1 voltage has a negative value in the first verify-read operation. At this time, a well voltage VWLL having a negative voltage NWV is provided to the well or wells (hereinafter, "well(s)") of the address decoder 120 transistors and a high supply voltage VPP having a lower level VPPL is provided to a block wordline BWL within the address decoder 120.

After the pass of the first verify-read operation, a well voltage VWLL having a (default, ground) level of 0V is provided to the well(s) of the address decoder 120 transistors and a high supply voltage VPP having a first level VPPH is provided to the block wordline BWL within the address decoder 120.

A second verify-read operation is performed after the completion of the first verify-read operation. In the second verify-read operation, a well voltage VWLL having a (default, ground) level of 0V is provided to the well(s) of the address decoder 120 transistors and a high supply voltage VPP having a (higher) first level VPPH is provided to the block wordline BWL within the address decoder 120.

A third verify-read operation is performed after the completion of the second verify-read operation.

The control logic unit 150 determines whether the first to third verify-read operations are all a program pass (S140). If some of the first to third verify-read operations pass in the current ISPP program loop, the control logic unit 150 excludes the passed verify-read operations from the next ISPP program loop.

If the first to third verify-read operations are all a program pass, the ISPP program loop is ended. On the other hand, if at least one of the first to third verify-read operations is a program fail, the control logic unit 150 determines whether the ISPP loop count (i) is maximum (S150). If the ISPP loop count (i) is maximum, the program operation fails. On the other hand, if the ISPP loop count (i) is not maximum, the ISPP loop count (i) increases by 1 and the next ISPP program loop is performed (S160).

Figure 5:
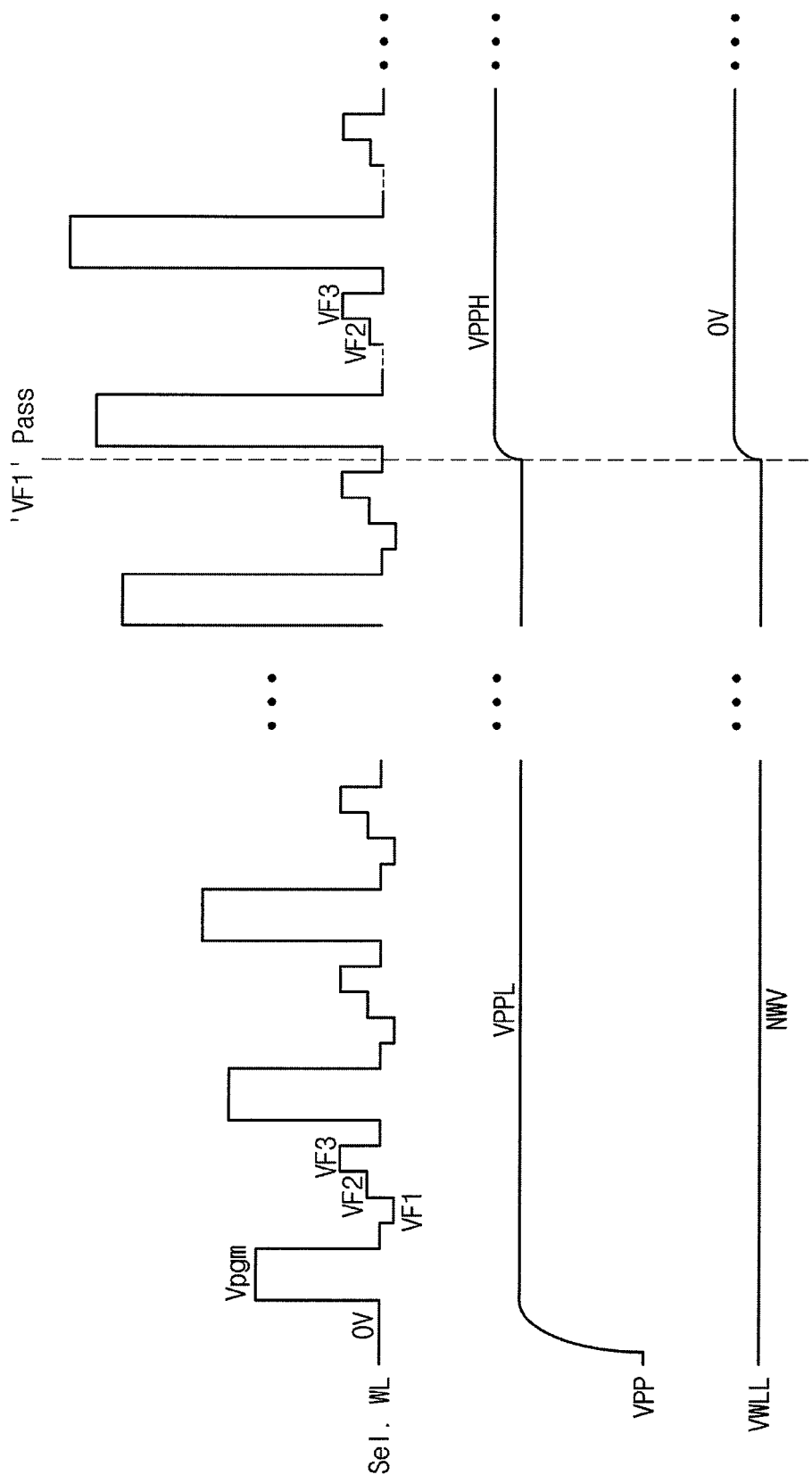
FIG. 5 is a time-voltage graph illustrating a second well voltage/high supply voltage control method in a program operation according to the threshold voltage distribution of FIG. 2.

FIG. 5 is a time-voltage graph illustrating a second well voltage/high supply voltage control method in a program operation according to the four-state threshold voltage distribution of FIG. 2.

Referring to FIG. 5, the nonvolatile memory device 100 performs a program operation according to an ISPP method.

Until a first verify-read operation of a first verify level VF1 passes, the well voltage VWLL has the negative level NWV during the first verify-read in each ISPP loop and the high supply voltage VPP is continuously maintained at the (lower) second level VPPL.

After the first verify-read operation passes, the well voltage VWLL has a (default) level of 0V and the high supply voltage VPP has the (higher) first level VPPH. Herein, the first level VPPH is higher than the second level VPPL.

As described above, the well voltage VWLL is 0V after the first verify-read operation passes in any ISPP loop. However, the well voltage VWLL is not necessarily 0V after the first verify-read operation passes. The well voltage VWLL may have a level higher than a negative level NWV after the first verify-read operation passes in any ISPP loop.

Figure 6:
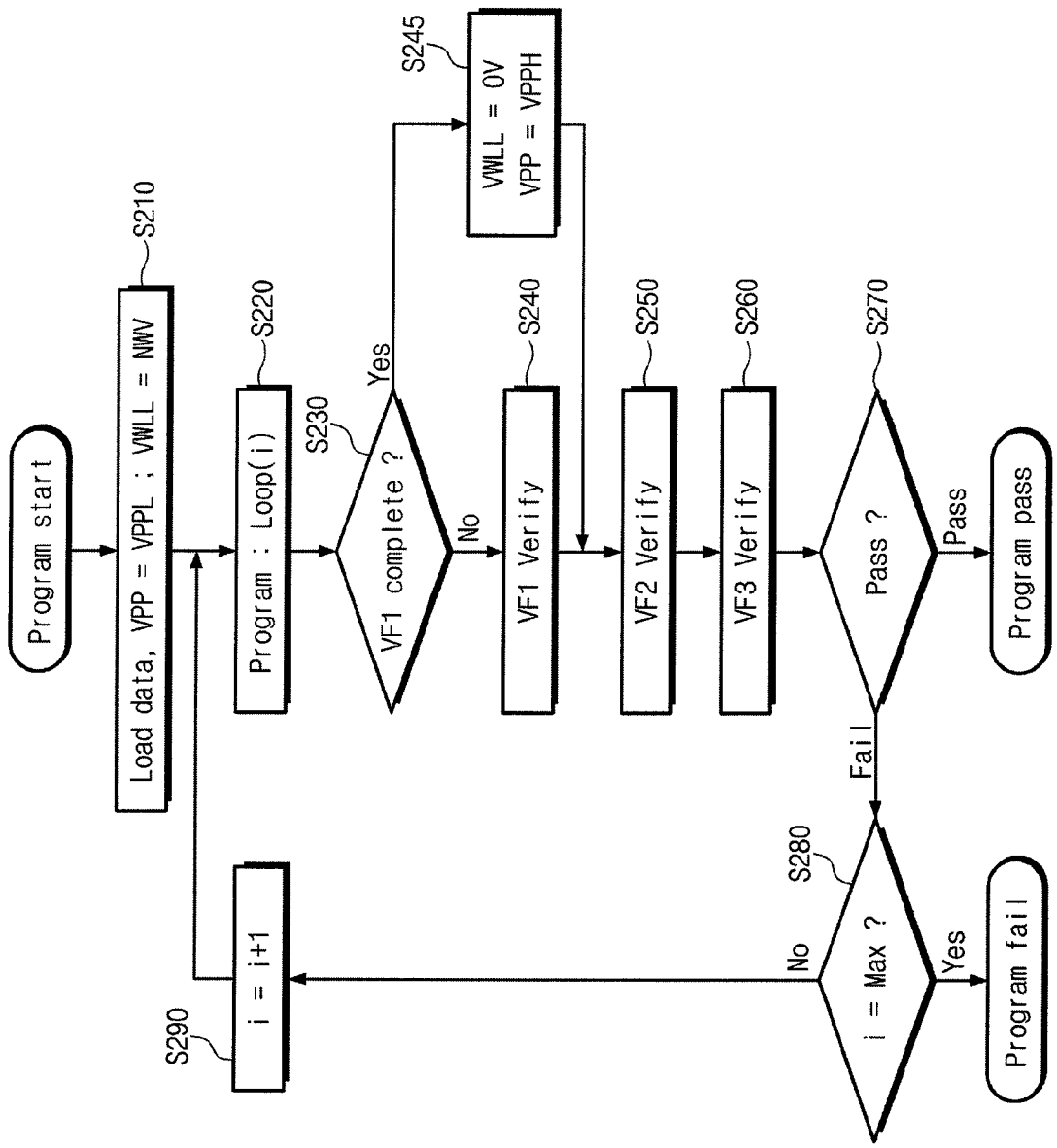
FIG. 6 is a flow chart of the second program method of the nonvolatile device 100 of FIG. 1.

FIG. 6 is a flow chart of the second program method of the nonvolatile method device 100 of FIG. 1.

Referring to FIGS. 1, 2, 5 and 6, the program method of the nonvolatile memory device proceeds as follows.

In a program operation, program data are loaded into each of the page buffers PB0-PBn-1 of the I/O circuit 130 (see FIG. 1). A well voltage VWLL set to a negative voltage NWV is applied to the well(s) of transistors in the address decoder 120 (see FIG. 1) and a high supply voltage VPP is set to a (lower) second level VPPL (S210).

The control logic unit 150 performs an ISPP program loop (i). The control logic unit 150 sets up the bit lines BL0~BLn-1 according to the data loaded into the page buffers PB0~PBn-1. Thereafter, a pass voltage is applied to the unselected wordlines and a program voltage Vpgm is applied to the selected wordline Sel.WL (S220). Herein, the level of the program voltage Vpgm increases by a predetermined step value with each increase in the ISPP loop count (i).

The pass voltage Vpass may be applied to the selected wordline for a predetermined time before the application of the program voltage Vpgm. Thereafter, a program recovery operation is performed. In the program recovery operation, the bias voltages applied to the string selection lines SSL and the wordlines WL0~WLm-1 are discharged, and the voltages applied to the bit lines BL0~BLn-1 are discharged.

Thereafter, the control logic unit 150 determines whether a first verify-read operation was completed in the previous ISPP program loop (S230).

If the first verify-read operation was not completed in the previous program loop, the control logic unit 150 performs a first verify-read operation by applying first verify level VF1 voltage to determine whether the memory cells targeting a first program state P1 are programmed successfully (S240).

On the other hand, if the first verify-read operation was completed in the previous program loop, the well voltage VWLL to be provided to the address decoder 120 is set to 0V and the high supply voltage VPP is set to a first level VPPH under the control of the control logic unit 150.

Thereafter, the control logic unit 150 performs a second verify-read operation by applying a second verify level VF2 voltage to determine whether the memory cells targeting a second program state P2 are programmed successfully (S250), and next performs a third verify-read operation by applying a third verify level VF3 voltage to determine whether the memory cells targeting a third program state P3 are programmed successfully (S260).

The control logic unit 150 determines whether the first to third verify-read operations are all a program pass (S270). If some of the first to third verify-read operations pass in the current program loop, the control logic unit 150 excludes the passed verify operations from the next program loop. The passed verify operation period may be or may not be included in the program loop. For example, after the first verify-read operation passes, a first verify-read period denoted by a doted line may be or may not be included in the program loop as illustrated in FIG. 5.

If the first to third verify-read operations are all a program pass, the ISPP program loop is ended. On the other hand, if at least one of the first to third verify-read operations is a program fail, the control logic unit 150 determines whether the ISPP loop count (i) is maximum (S280). If the loop count (i) is maximum, the program operation fails. On the other hand, if the loop count (i) is not maximum, the loop count (i) increases by 1 (S290) and the next program loop is performed (S220).

An embodiment of invention is also applicable erased memory cells.

Figure 7:
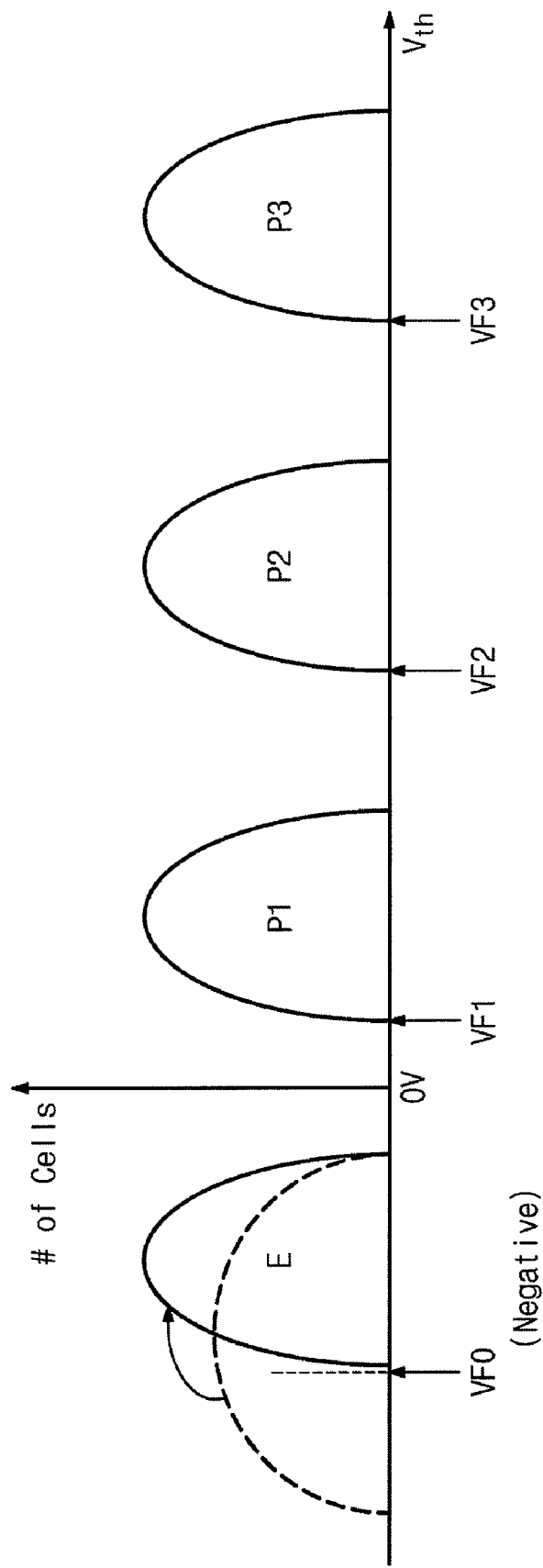
FIG. 7 is a graph of a threshold voltage distribution for the second program method of the nonvolatile memory device 100 of FIG. 1.

FIG. 7 is a graph of a threshold voltage distribution for the second program method of the nonvolatile memory device 100 of FIG. 1.

Referring to FIG. 7, when a program operation proceeds to first and third program states P1, P2 and P3, a verify-read operation is performed on an erase state E by applying an erase verify voltage VF0. Herein, the erase verify voltage level VF0 has a negative value.

Next, a verify-read operation is performed by applying a first verify voltage VF1 to determine whether memory cells reached the first program state P1. Then, a verify-read operation is performed by a second verify voltage VF2 to determine whether memory cells reached the second program state P2. And verify-read operation is performed by applying a third verify voltage VF3 to determine whether memory cells reached the third program state P3.

Figure 8:
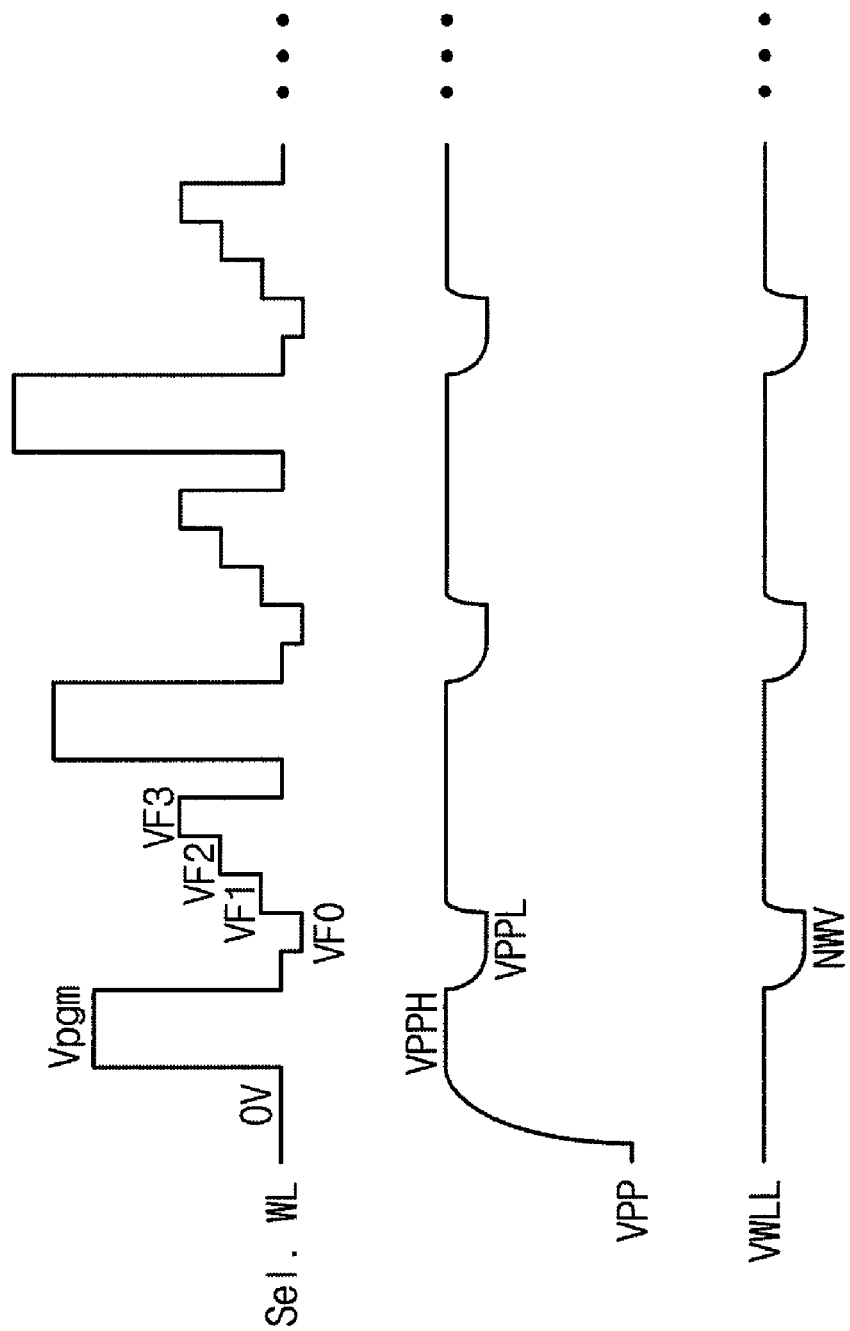
FIG. 8 is a time-voltage graph illustrating the second well voltage/high supply voltage control method in a program operation according to the threshold voltage distribution of FIG. 7.

FIG. 8 is a time-voltage graph illustrating the second well voltage/high supply voltage control method in a program operation according to the threshold voltage distribution of FIG. 7.

Referring to FIG. 8, the nonvolatile memory device 100 performs a program operation according an ISPP method.

When the program voltage Vpgm is applied to the selected wordline Sel.WL, the well voltage VWLL is 0V and the high supply voltage VPP has the (higher) first level VPPH. Thereafter, during a verify-read period while applying a negative first erase verify voltage VF0, the well voltage VWLL has a negative level NWV and the high supply voltage VPP has a (lower) second level VPPL. The second level VPPL is lower than the first level VPPH. Thereafter, during first state P1 verify-read operation periods while applying a first verify level VF1, a second state P2 verify-read operation period of a second verify level VF2 and a third state P3 verify-read operation period of a third verify level VF3, the well voltage VWLL is 0V and the high supply voltage VPP has the (higher) first level VPPH.

When a fail is detected in at least one of the verify-read operations of the three verify levels VF1, VF2 and VF3, the program voltage Vpgm is increased by a predetermined step level and is re-applied to the selected wordline Sel.WL. On the other hand, when a fail is not detected in any of the verify-read operations of the three verify levels VF1, VF2 and VF3, the ISPP program operation is ended.

As described above, the well voltage VWLL is 0V in the periods other than the first erase verify-read period. However, the well voltage VWLL is not necessarily 0V in the periods other than the first erase verify-read period. In the periods other than the first erase verify-read period, the well voltage VWLL has a level higher than the negative level NWV.

There is one verify level with a negative value in each of the threshold voltage distribution of FIGS. 2 and 7. However, the invention is not limited thereto. The invention is also applicable to a method of performing a program verify operation including a plurality of negative verify voltage levels.

Figure 9:
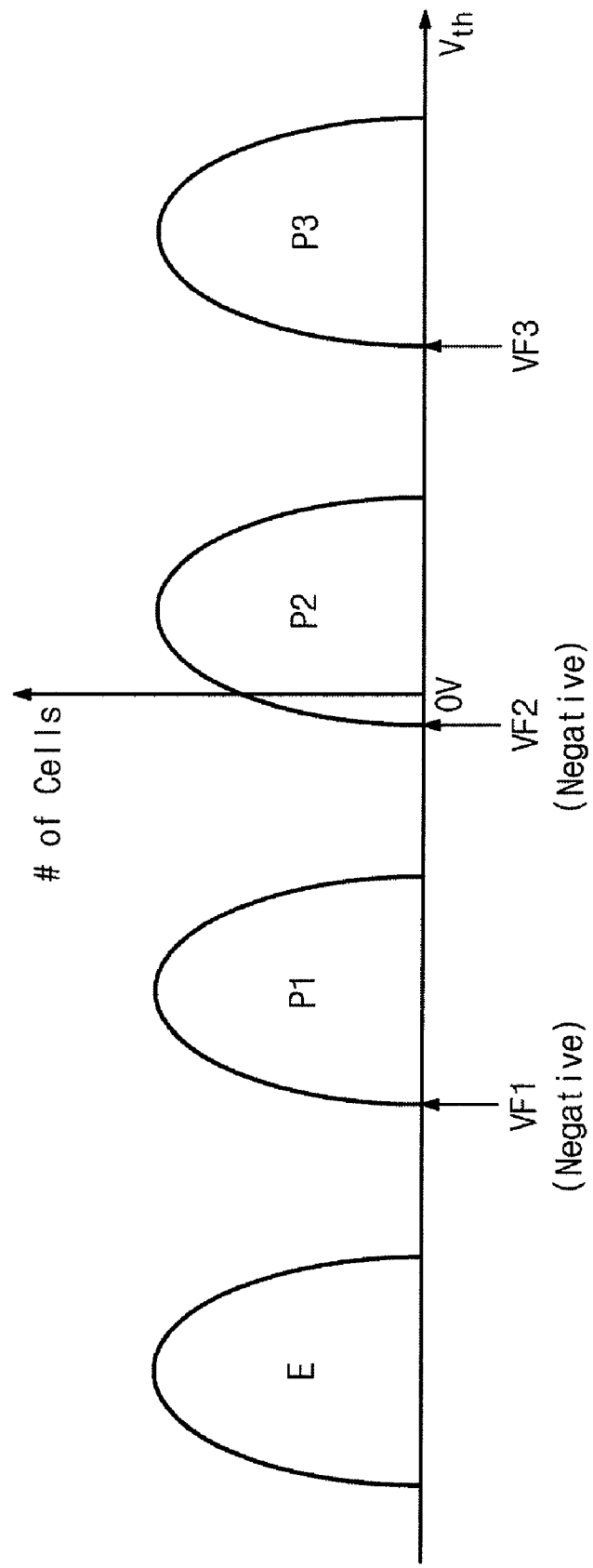
FIG. 9 is a graph of a threshold voltage distribution for a third program method of the nonvolatile memory device 100 of FIG. 1.

FIG. 9 is a graph of a threshold voltage distribution for a third program method of the nonvolatile memory device 100 of FIG. 1.

Referring to FIG. 9, an erase state E, a first program state P1, and a portion of a second program state P2 are present in a negative voltage region of the threshold distribution graph. In this case, both of a first verify level VF1 and a second verify level VF2 are negative voltages.

Figure 10:
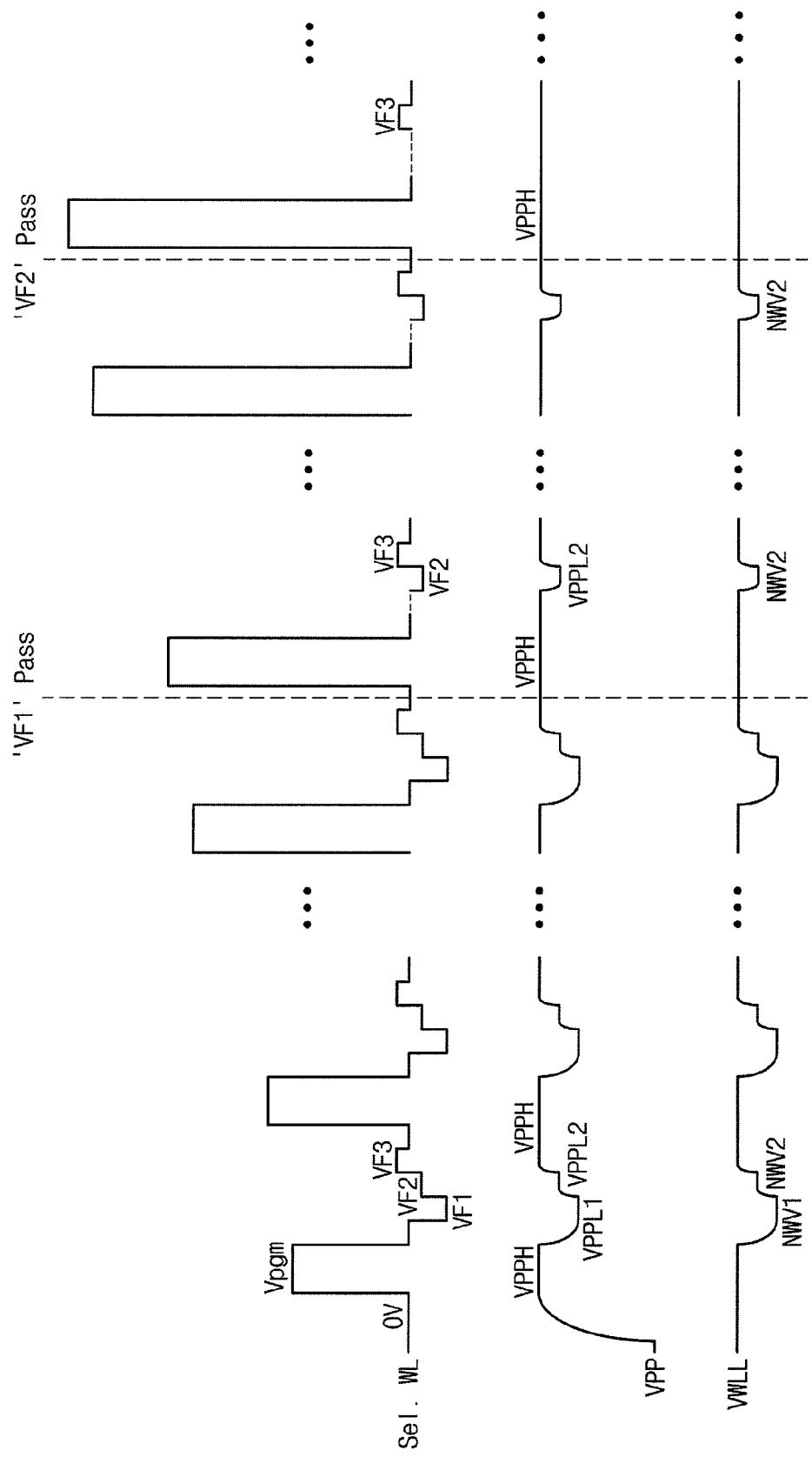
FIG. 10 is a time-voltage graph illustrating a first exemplary well voltage/high supply voltage control method in a program operation according to the threshold voltage distribution of FIG. 9.

FIG. 10 is a time-voltage graph illustrating a first exemplary well voltage/high supply voltage control method in a program operation according to the four-state threshold voltage distribution of FIG. 9.

Referring to FIG. 10, until a first verify-read VF1 operation passes, during each first verify-read VF1 operation the well voltage VWLL has a first negative level NWV1 and the high supply voltage VPP has a (lowest) level VPPL1 within each first verify-read period. After the first and second verify-read operations pass, the well voltage VWLL has a level 0V and the high supply voltage VPP has a level VPPH.

Until a second verify-read operation passes, during each second verify-read VF2 operation the well voltage VWLL has a second negative level NWV2 and the high supply voltage VPP has a (lower) level VPPL2 in each second verify-read period. Herein, the second negative level NWV2 is higher (less negative) than the first negative level NWV1, and the level VPPL2 is higher than the level VPPL1. After the second verify-read operation passes, the well voltage VWLL has a level 0V and the high supply voltage VPP has a nominal level VPPH.

The passed verify operation period may be or may not be included in the next ISPP program loop. For example, as illustrated in FIG. 10, a first verify-read period denoted by a dotted line may be or may not be included in the program loop after the first operation passes. Also, first and second verify-read periods denoted by dotted lines may be or may not be included in the program loop after the first and second verify-read operations pass.

As described above, the well voltage VWLL is 0V in the periods other than the first and second verify-read periods. However, the well voltage VWLL is not necessarily 0V in the periods other than the first and second verify-read periods. In the periods other than the first and second verify-read periods, the well voltage VWLL may have a level higher (less negative) than the second negative level NWV2.

Figure 11:
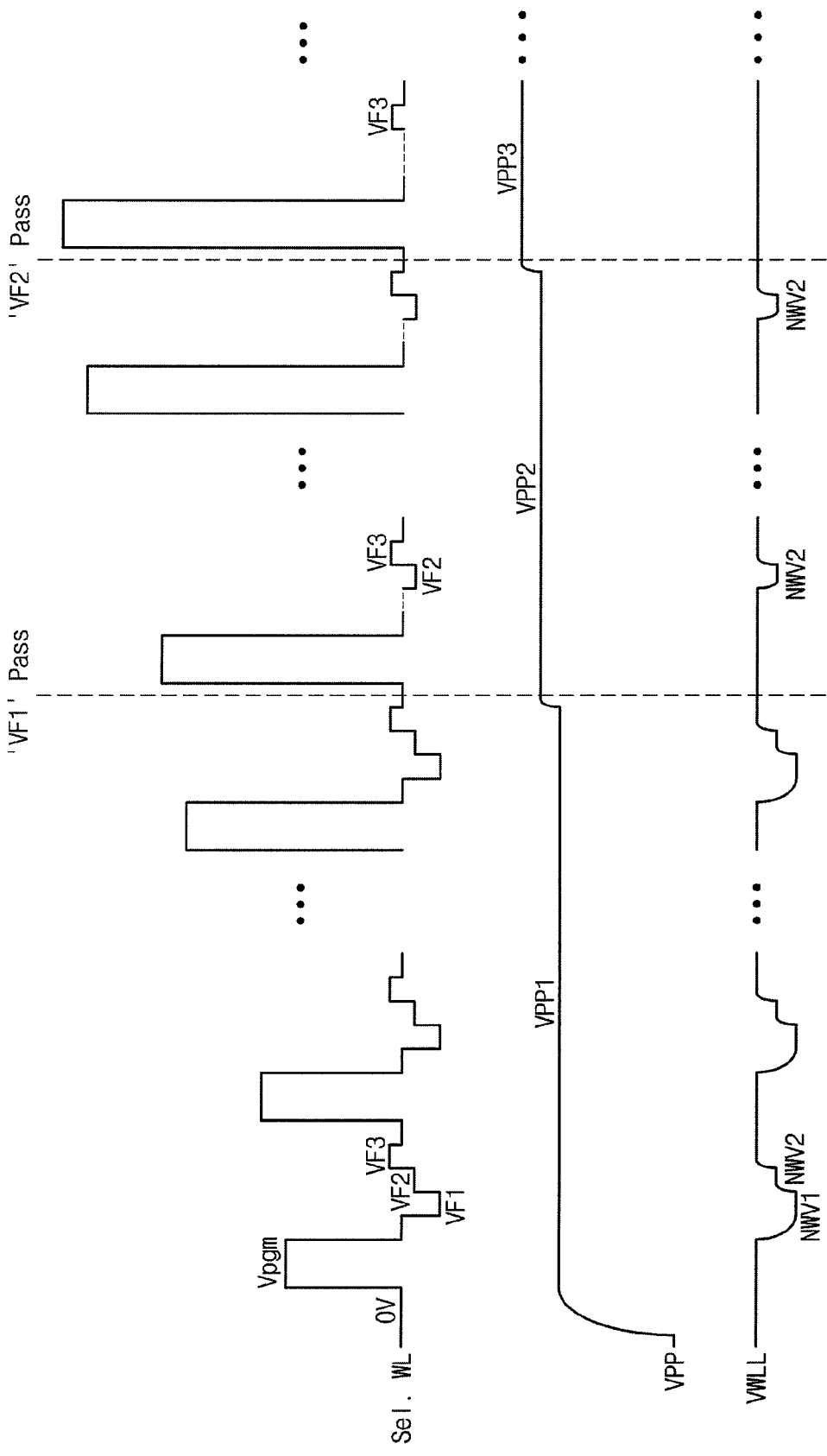
FIG. 11 is a time-voltage graph illustrating a second exemplary well voltage/high supply voltage control method in a program operation according to the threshold voltage distribution of FIG. 9.

FIG. 11 is a time-voltage graph illustrating a second exemplary well voltage/high supply voltage control method in a program operation according to the four-state threshold voltage distribution of FIG. 9.

Referring to FIG. 11, until a first verify-read VF1 operation passes, a high supply voltage VPP has a first level VPP1. Herein, the well voltage VWLL has a first negative level NWV1 during a first verify-read period VF1, and the well voltage VWLL has a second negative level NWV2 during a second verify-read period VF2. Then, after the first verify-read operation passes, the high supply voltage VPP has a (lowest) second level VPP2 until the second verify-read VF2 operation passes. Herein, the well voltage VWLL has a second negative level NWV2 during the second verify-read period VF2.

The high supply voltage VPP has a third level VPP3 (e.g., VPPH) after the second verify-read operation passes (until the third verify-read VH3 operation passes).

The passed verify operation period(s) may be or may not be included in the next ISPP program loop. For example, as illustrated in FIG. 11, a first verify-read period denoted by a dotted line may be or may not be included in the ISPP program loop after the first operations pass. Also, first and second verify-read periods denoted by dotted lines may be or may not be included in the program loop after the first and second verify-read operations pass.

As described above, the well voltage VWLL is 0V in the periods other than the first or second verify-read periods. However, the well voltage VWLL is not necessarily 0V in the periods other than the first or second verify-read period, and the well voltage VWLL is not necessarily 0V in the periods other than the second verify-read period. In the periods other than the first or second verify-read period, the well voltage VWLL may have a level higher than the second negative level NWV2.

Figure 12:
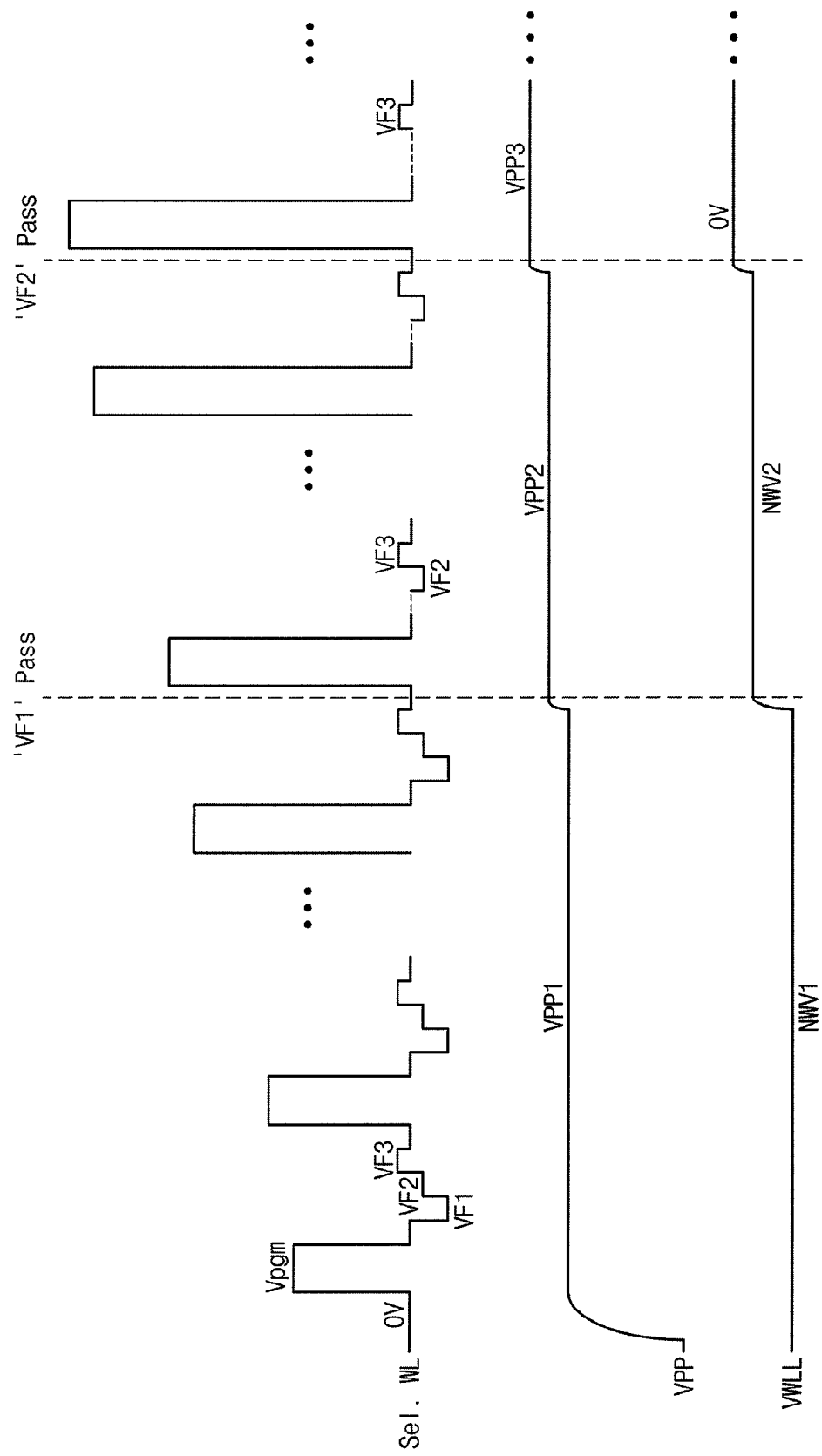
FIG. 12 is a time-voltage graph illustrating a third exemplary well voltage/high supply voltage control method in a program operation according to the threshold voltage distribution of FIG. 9.

FIG. 12 is a time-voltage graph illustrating a third exemplary well voltage/high supply voltage control method in a program operation according to the threshold voltage distribution of FIG. 9.

Referring to FIG. 12, until a first verify-read operation passes, the high supply voltage VPP has a (lowest) first level VPP1 and the well voltage VWLL has a (lowest) first negative level NWV1. After the first verify-read operation passes, the high supply voltage VPP has a second level VPP2 and the well voltage VWLL has a second negative level NWV2 until the second verify-read operation passes.

After the second verify-read operation passes, the high supply voltage VPP has a third level VPP3 (e.g., VPPH) (e.g., until the third verify-read operation passes).

The passed verify operation period(s) may be or may not be included in the next ISPP program loop. For example, as illustrated in FIG. 12, a first verify-read period denoted by a dotted line may be or may not be included in the ISPP program loop after the first and second verify-read operation passes. Also, first and second verify-read periods denoted by dotted lines may be or may not be included in the program loop after the first and second verify-read operations pass.

As described above, the well voltage VWLL is 0V after the pass of the first and second verify-read operations. However, the well voltage VWLL is not necessarily 0V after the pass of the first and second verify-read operations. After the pass of the first and second verify-read operations, the well voltage VWLL may have a level higher than the second negative level NWV2.

The nonvolatile memory device 100 according to various exemplary embodiments of the invention is applicable to any operation involving applying a negative voltage to a wordline (e.g., a program operation, a read operation, an erase operation, and a verify-read operation). For example, embodiments of the invention are also applicable to an LSB (least Significant Bit) program operation or an MSB (Most Significant Bit) program operation.

Figure 13:
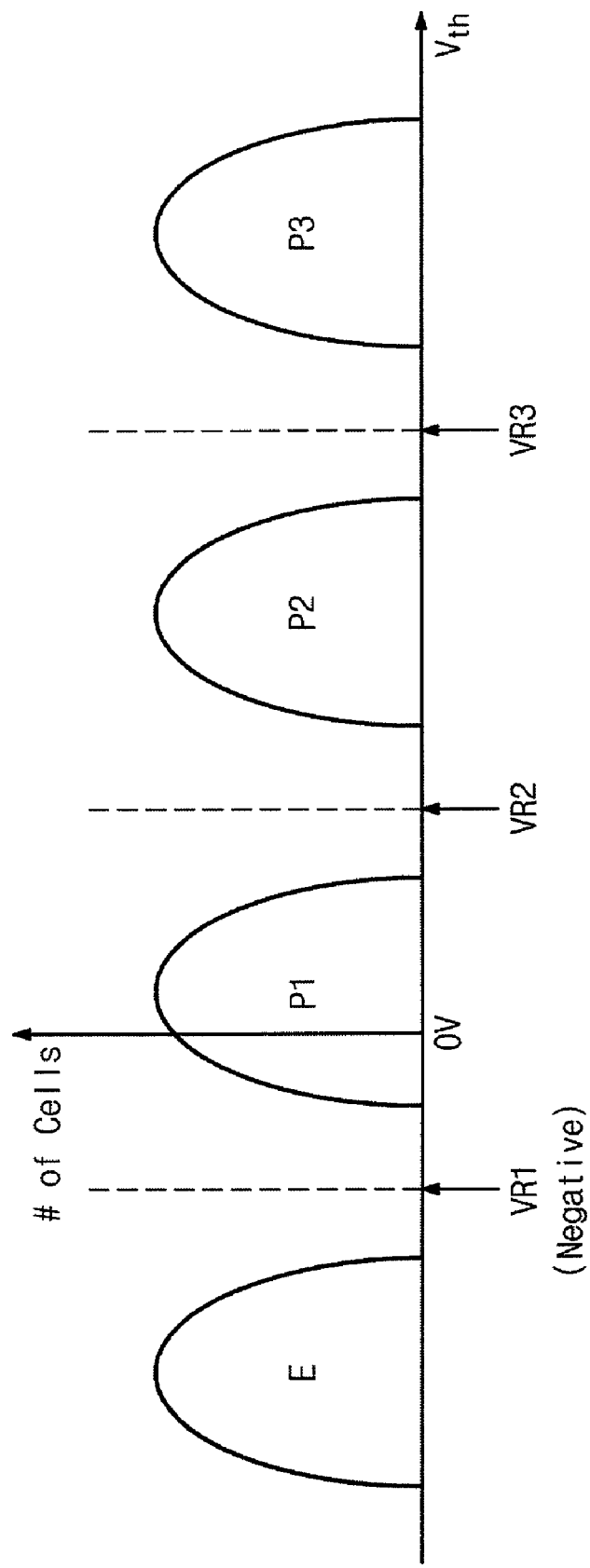
FIG. 13 is a graph of a threshold voltage distribution for a read operation of the nonvolatile memory device 100 of FIG. 1.

FIG. 13 is a graph of a four state threshold voltage distribution for a read operation of the nonvolatile memory device 100 of FIG. 1.

Referring to FIG. 13, a first read level VR1 has a negative value. The nonvolatile memory device 100 varies the well voltage VWLL and the high supply voltage VPP during the first read while a selected wordline Sel.WL is at negative voltage level VR1.

Embodiments of the invention are also applicable to a 3-bit MLC nonvolatile memory device.

Figure 14:
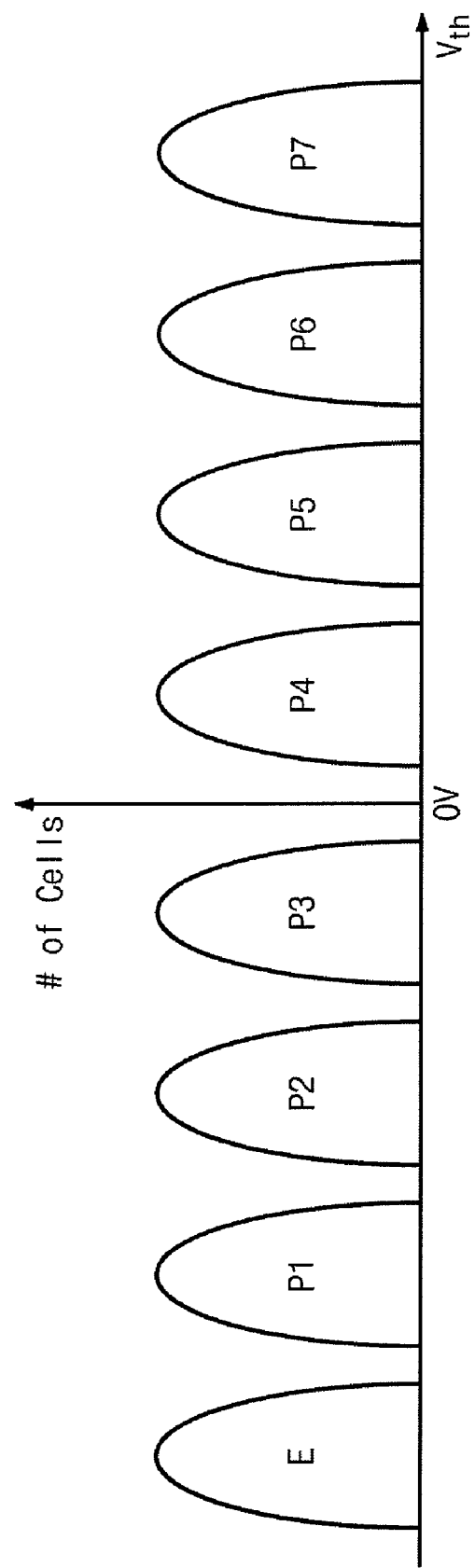
FIG. 14 is a graph of a threshold voltage distribution for a program method of a 3-bit (eight state) MLC nonvolatile memory device according to an exemplary embodiment of the invention.

FIG. 14 is a graph of a threshold voltage distribution for a program method of a 3-bit MLC nonvolatile memory device according to an exemplary embodiment of the invention.

Referring to FIG. 14, a negative voltage is applied to a wordline in a read operation or a verify-read operation for first to third program states P1, P2 and P3. Herein, the nonvolatile memory device 100 varies the well voltage VWLL and the high supply voltage VPP according to whether a negative voltage is applied to a selected wordline Sel.WL.

Embodiments of the invention are also applicable to a 4-bit (sixteen state) MLC nonvolatile memory device.

Figure 15:
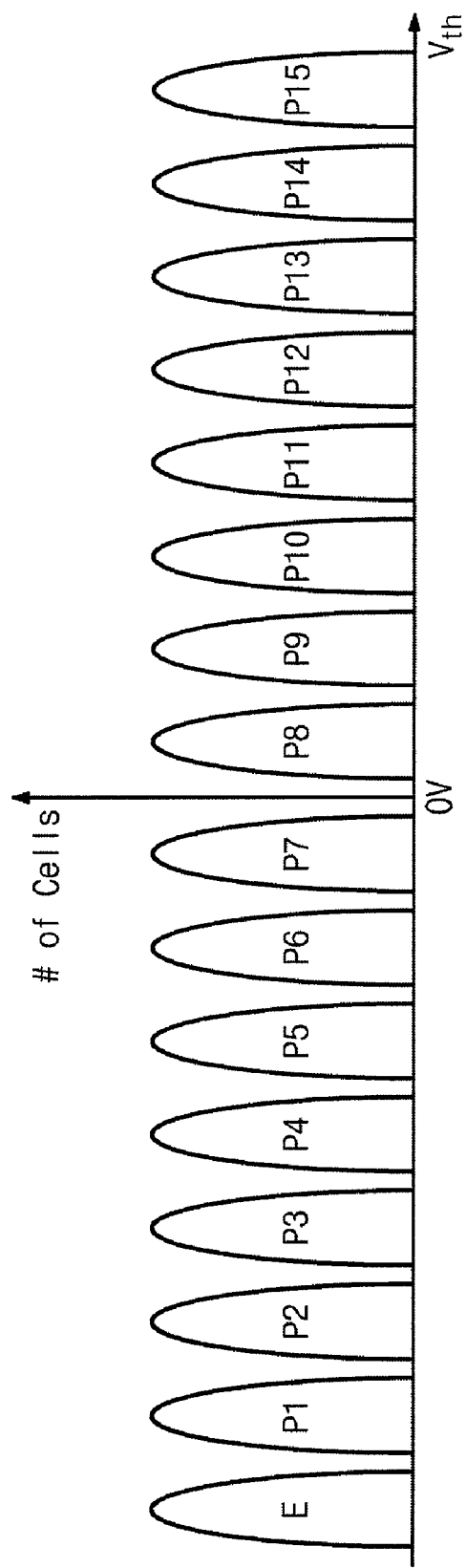
FIG. 15 is a graph of a threshold voltage distribution for a program method of a 4-bit MLC nonvolatile memory device according to an exemplary embodiment of the invention.

FIG. 15 is a graph of a threshold voltage distribution for a program method of a 4-bit (sixteen state) MLC nonvolatile memory device according to an exemplary embodiment of the invention.

Referring to FIG. 15, a negative voltage is applied to a selected wordline Sel.WL in a read operation or a verify-read operation for first to seventh program states P1~P7. Herein, the nonvolatile memory device 100 varies the high supply voltage VPP according to the well voltage VWLL.

Figure 16:
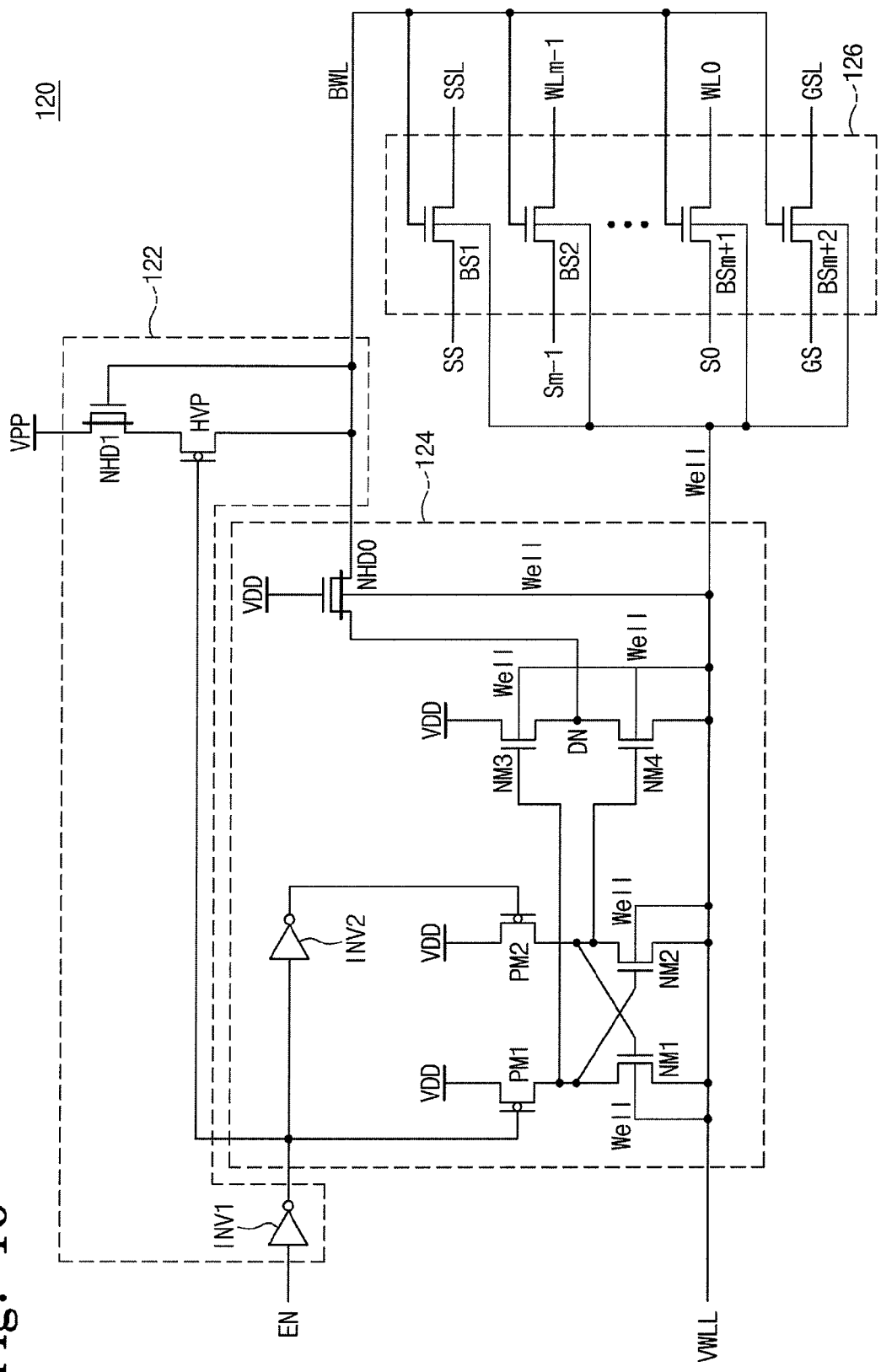
FIG. 16 is a circuit diagram of the address decoder 120 in the nonvolatile memory device 100 of FIG. 1.

FIG. 16 is a circuit diagram of the address decoder 120 in the nonvolatile memory device 100 of FIG. 1.

Referring to FIG. 16, the address decoder 120 includes a pull-up circuit 122, a pull-down circuit 124, and a memory block selection circuit 126. However, address decoders that embody the invention are not limited to this circuit architecture.

The pull-up circuit 122 is connected between a high supply voltage VPP and a block wordline BWL. The pull-up circuit 122 provides the high supply voltage VPP to the wordline BWL in response to a memory block enable signal EN. Herein, the memory block enable signal EN is generated by combining a discharge signal and a block selection signal determined according to an address ADDR.

The pull-up circuit 122 includes a depletion transistor NHD1, a (high-voltage) PMOS transistor HVP, and an inverter INV1. The depletion transistor NHD1 has a drain connected to the high supply voltage VPP and a gate connected to the block wordline BWL. The depletion transistor NHD1 and the PMOS transistor HVP are connected in series between the high supply voltage VPP to the wordline BWL. Thus, for example, the PMOS transistor HVP has a source connected to the source of the depletion transistor NHD1, a drain connected to the block wordline BWL, and a gate to which a signal obtained by inverting the block enable signal EN is inputted. Herein, the inverting of the block enable signal EN is performed by the inverter INV1. The PMOS transistor may be a high-voltage transistor.

The pull-up circuit 122 switchably passes the high supply voltage VPP to the block wordline BWL in response to the high-level block enable signal EN. The providing of the high supply voltage VPP to the block wordline BWL is performed as follows.

When the high-level block enable signal EN is active high, the inverter INV1 outputs an active low signal. The PMOS transistor HVP is turned ON in response to the low signal outputted from the inverter INV1. Herein, it is assumed that the initial level of the block wordline BWL is 0V. Thus, the depletion transistor NHD1 provides a threshold voltage of the depletion transistor NHD1 (e.g., about 2V) to the block wordline BWL in response to a gate voltage of 0V. Accordingly, the voltage of the block wordline BWL increases, and the increased voltage of the block wordline BWL is fed back to the gate of the depletion transistor NHD1. The depletion transistor NHD1 increases the voltage of the block wordline BWL in response to the feedback voltage. The depletion transistor NHD1 prevents a sudden increase in the voltage of the block wordline BWL. By repetition of the above feedback operation, the voltage of the block wordline BWL increases up to the high supply voltage VPP.

On the other hand, when receiving the low block enable signal EN, the inverter INV1 outputs a high signal. The PMOS transistor HVP is turned OFF in response to the high signal outputted from the inverter INV1.

The pull-down circuit 124 switchably connects between the block wordline BWL and the well voltage VWLL. While the high supply voltage VPP is applied to the block wordline BWL, in response to the active block enable signal EN, the pull-down circuit 124 electrically disconnects the block wordline BWL from a well(s) of the address decoder 120. Conversely, in response to the inactive block enable signal EN, the pull-down circuit 124 electrically connects the well(s) of the address decoder 120 to the block wordline BWL. Thus, the pull-down circuit 124 provides the well voltage VWLL to the block wordline BWL in response to the inactive block enable signal EN.

The pull-down circuit 124 includes a depletion transistor NHD0, PMOS transistors PM1 and PM2, NMOS transistors NM1-NM4, and an inverter INV2. The depletion transistor NHD0 is connected between the block wordline BWL and a node DN. The depletion transistor NHD0 and the NMOS transistor NM4 are connected together in series between the block wordline BWL and the well voltage VWLL.

The depletion transistor NHD0 prevents the high supply voltage VPP on the block wordline BWL from being discharged suddenly in a discharge operation. The depletion transistor NHD0 electrically disconnects the well voltage VWLL from the block wordline BWL in response to the active high block enable signal EN. The inverter INV1 outputs a low signal in response to the high block enable signal EN. The PMOS transistor PM1 is turned ON in response to the low inverted block enable signal EN signal. When the PMOS transistor PM1 is turned ON, a power supply voltage VDD is inputted to the gate of the NMOS transistor NM3. Thus, the NMOS transistor NM3 is turned ON. Accordingly, the power supply voltage VDD is provided to the node DN. Herein, when the voltage of the node DN further increases to the threshold voltage of the depletion transistor NHD0, the depletion transistor NHD0 is turned OFF. Accordingly, the pull-down circuit is electrically OFF as a switch between the block wordline BWL and the well voltage VWLL in response to the active high block enable signal EN.

The NMOS transistors NM1-NM2, the depletion transistor NHD0, and block selection transistors BS1-BSm+2 of the block selection circuit 126 share one well or may have a plurality of physically separated electrically connected wells. Herein, a well voltage VWLL is provided to the shared well or to all the separate wells. Throughout this application and in the claims, the singular term "well" includes a plurality "wells" connected to the same well voltage VWLL unless context indicates otherwise.

The pull-down circuit 124 applies the well voltage VWLL to the block wordline BWL in response to the low block enable signal EN. The providing of the well voltage VWLL to the block wordline BWL is performed as follows.

When receiving the inactive low block enable signal EN, the inverter INV1 outputs a high signal. The inverter INV2 receives the high signal from the inverter INV1 to output a low signal. The PMOS transistor PM2 is turned ON in response to the low signal outputted from the inverter INV2, and the power supply voltage VDD is provided by the turned-ON PMOS transistor PM2 to the gate of the NMOS transistor NM4. Thus, the NMOS transistor NM4 is turned ON and the well voltage VWLL is thus applied to the node DN.

When the voltage of the block wordline BWL is 0V, the well voltage VWLL on the node DN is applied through the depletion transistor NHD0 to the block wordline BWL. At this time, the voltage of the block wordline BWL is the well voltage VWLL. The well voltage VWLL may be lower than 0V. On the other hand, when the voltage of the block wordline BWL is the high supply voltage VPP, the depletion transistor NHD0 discharges the high supply voltage VPP of the block wordline BWL. As a result, the voltage of the block wordline BWL becomes the well voltage VWLL.

In response to the high supply voltage VPP provided to the block wordline BWL, the block selection circuit 126 connects selection lines GS, S0-Sm−1 and SS respectively to the ground selection line GSL, the wordlines WL0-WLm−1 and the string selection line SSL of the selected memory block.

Although not illustrated in FIG. 16, a plurality of memory blocks share the selection lines GS, S0~Sm−1 and SS, and the address decoder 120 multiplexes these selection lines for plurality of memory blocks. In a program/read/erase operation, the wordline voltages (e.g., a program voltage, a pass voltage, a read voltage, and a verify-read voltage) generated by the wordline voltage generator 142 (see FIG. 1) are selectively transmitted to the selection lines GS, S0-Sm−1 and SS.

The block selection circuit 126 includes a plurality of block selection transistors BS1-BSm+2. All of the gates of the block selection transistors BS1-BSm+2 are connected to the block wordline BWL. Also, the block selection transistors BS1-BSm+2 of each block selection circuit 126 may share a well. The block selection transistors BS1-BSm+2 of each block selection circuit 126 may share a well with the NMOS transistors NM1-NM2, the depletion transistor NHD0, and block selection transistors BS1-BSm+2. In this exemplary embodiment, the well voltage VWLL is provided to the shared well as illustrated in FIG. 16.

A nonvolatile memory device 100 made according to any embodiment of the invention can prevent the PN junction breakdown of the depletion transistor NHD0. A voltage equal to the high supply voltage VPP minus the well voltage VWLL is applied to the PN junction of the depletion transistor NHD0 between the block wordline BWL and the well of the depletion transistor NHD0. Meanwhile, the same voltage difference equal to the high supply voltage VPP minus the well voltage VWLL may also be applied across the PN junctions of the block selection transistors BS1-BSm+2 of the enabled block selection circuit 126. Thus, under the control of the control logic unit 150 (see FIG. 1), the high supply voltage VPP and the well voltage VWLL are adjusted so that their difference does not exceed the PN junction breakdown voltage (e.g., 30V), thereby preventing the breakdown of the PN junction created between the block wordline BWL and the well of the depletion transistor NHD.

As described above, the nonvolatile memory device 100 adjusts the high supply voltage VPP and the well voltage VWLL according to whether a negative voltage is applied to the selected wordline Sel.WL, thereby preventing the PN junction breakdown of at least one transistor included in the address decoder 120. Accordingly, the reliability of the nonvolatile memory device 100 is improved.

Figure 17:
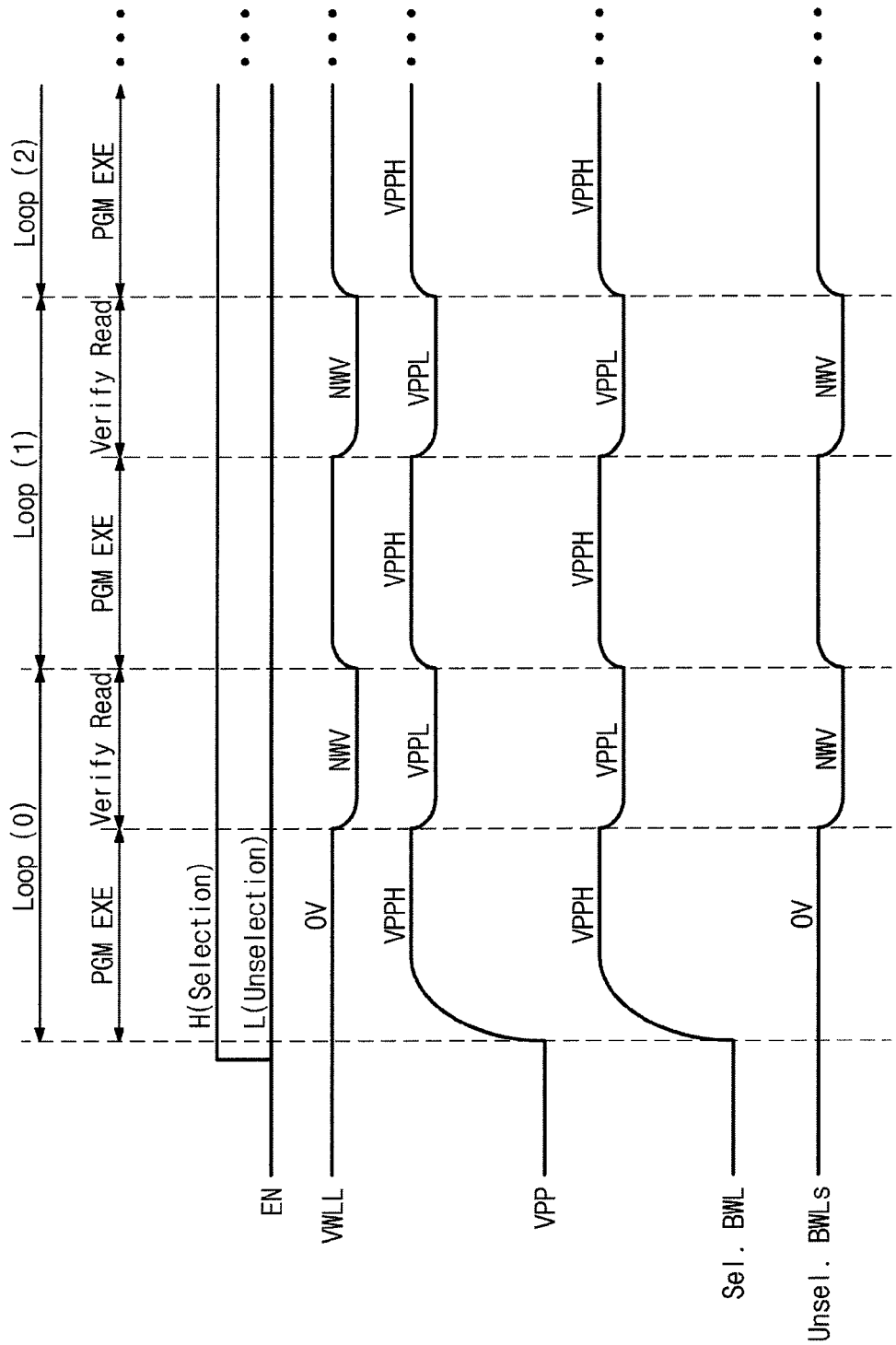
FIG. 17 is a time-voltage graph illustrating a voltage control method in a program operation of the nonvolatile memory device 100 of FIG. 1.

FIG. 17 is a time-voltage graph illustrating a voltage control method in a program operation of the nonvolatile memory device 100 of FIG. 1.

Referring to FIGS. 1, 16 and 17, a voltage control method in a program operation is performed as follows.

First, in the case of the memory block selected by the input address ADDR, the enable signal EN applied has a high level. In a program execution period of the first ISPP program loop (0), the control logic unit 150 controls the negative voltage (NV) generator 146 (see FIG. 1) to generate the well voltage VWLL with a level of 0V, and controls the high voltage generator 144 to generate the high supply voltage VPP with a (highest) first level VPPH. Herein, the address decoder 120 (see FIG. 1) provides a high voltage with the first level VPPH to the selected block wordline BWL in response to the active high enable signal EN.

Thereafter, in a verify-read period of the first ISPP program loop (0), the control logic unit 150 controls the negative voltage (NV) generator 146 to generate the well voltage VWLL with a negative level NWV, and controls the high voltage generator 144 to generate the high supply voltage VPP with a (lower) second level VPPL. Herein, the second level VPPL is lower than the first level VPPH. Also, the difference between the second level VPPL and the negative level NWV is not greater than the junction breakdown voltage (e.g., 30V) of the depletion transistor NHD0 (see FIG. 16).

At this point, the address decoder 120 provides the high voltage with the lower second level VPPL to the selected block wordline Sel.BWL in response to the active high enable signal EN.

Meanwhile, in the case of the memory block unselected by the input address ADDR, the received enable signal EN has an inactive, low, level. In a program execution period of the first program loop (0), the well voltage VWLL with a level of 0V is provided to the unselected wordlines Unsel.BWLs in response to the inactive/low enable signal EN. Thereafter, in a verify-read period of the first program loop (0), the well voltage VWLL with a negative level NWV is provided to the unselected wordlines Unsel.BWLs in response to the inactive/low enable signal EN.

The above described operations in the first ISPP program loop (0) are similarly applied to the next ISPP program loops (1, 2, . . . ).

As described above, the nonvolatile memory device 100 decreases the level of the high supply voltage VPP when the well voltage having a negative level is applied in the verify-read period.

In the nonvolatile memory device 100 of FIG. 1, the voltage selection switch unit 148 is provided outside the address decoder 120. However, the invention is not limited thereto. A voltage selection switch unit may be provided within an address decoder 220 as illustrated in FIG. 18.

Figure 18:
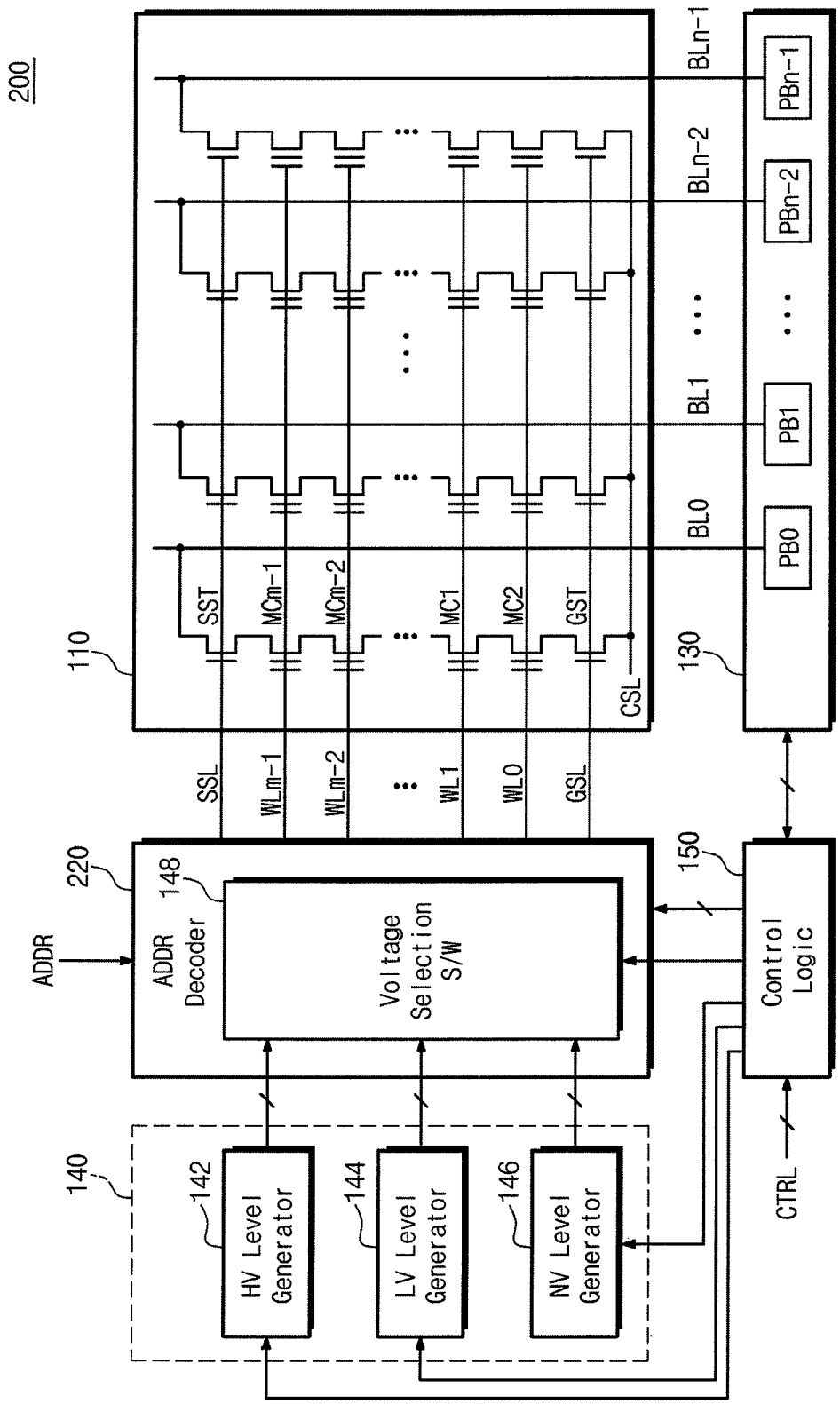
FIG. 18 is a block diagram of a nonvolatile memory device 200 according to a second exemplary embodiment of the invention.

FIG. 18 is a block diagram of a nonvolatile memory device 200 according to a second exemplary embodiment of the invention wherein the voltage selection switch 148 is included within an address decoder 220 rather than within the voltage generator 140. Otherwise, nonvolatile memory device 200 of FIG. 18 is similar or the same as nonvolatile memory device 100 of FIG. 1, and a redundant description is omitted.

Figure 19:
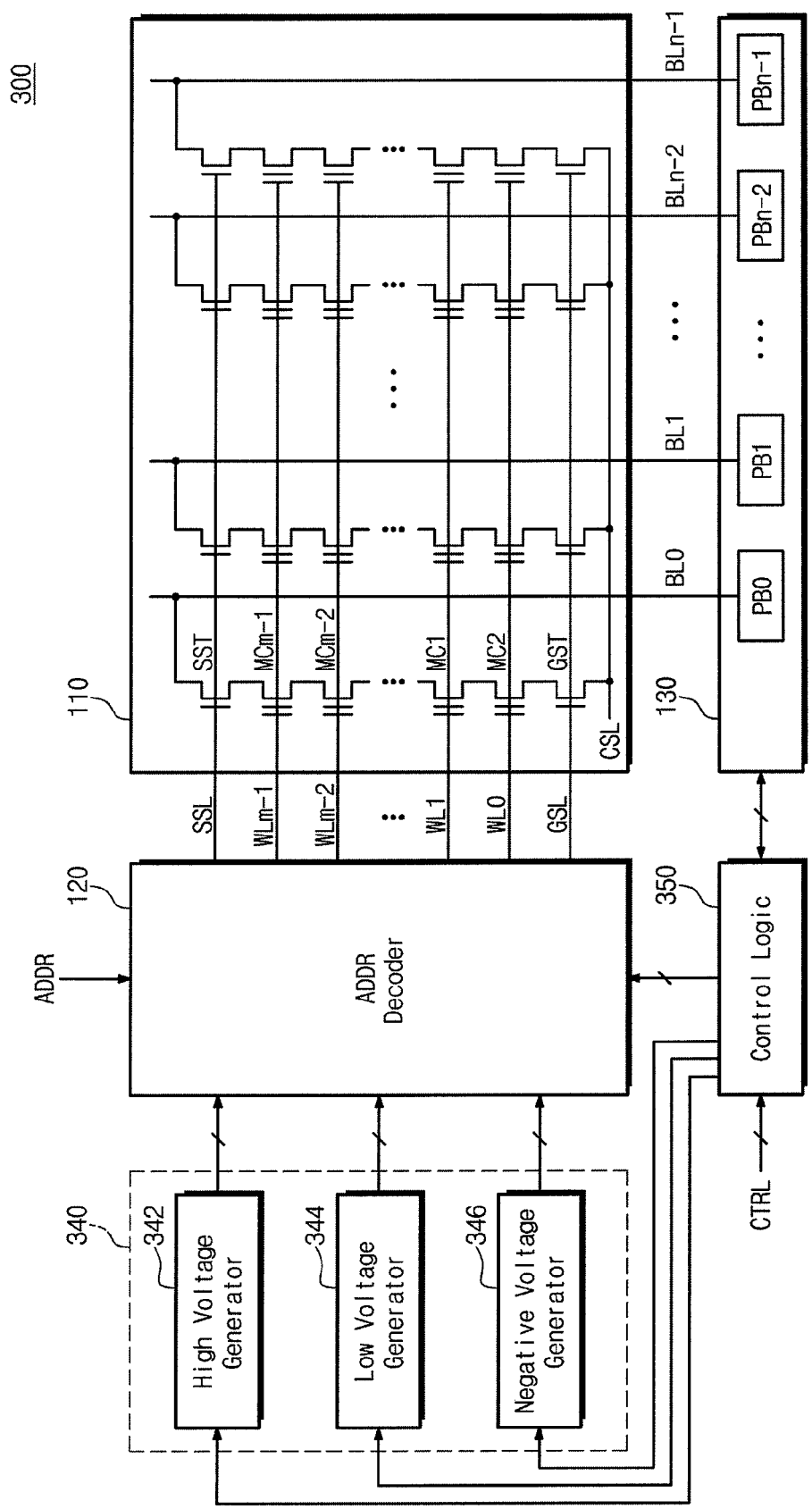
FIG. 19 is a block diagram of a nonvolatile memory device 300 according to a third exemplary embodiment of the invention.

FIG. 19 is a block diagram of a nonvolatile memory device 300 according to a third exemplary embodiment of the invention.

Referring to FIG. 19, a nonvolatile memory device 300 includes a memory cell array 110, an address decoder 120, an I/O circuit 130, a voltage generator 340, and a control logic unit 350.

The memory cell array 110, the address decoder 120, and the I/O circuit 130 of FIG. 19 are configured the same as the memory cell array 110, the address decoder 120, and the I/O circuit 130 of FIG. 1.

The voltage generator 340 includes a high voltage generator 342, a low voltage generator 344, and a negative voltage generator 346. The high voltage generator 342 generates high supply voltage VPP and the high voltages necessary for a program/read/erase operation under the control of the control logic unit 350. The low voltage generator 344 generates the low voltages necessary for a program/read/erase operation under the control of the control logic unit 350. The negative voltage generator 346 generates a negative voltages necessary for a program/read/erase operation under the control of the control logic unit 350. Herein, the negative voltages may be applied as the negative wordline voltage applied to the selected wordline Sel.WL and the well voltage applied to the well(s) of the address decoder 120.

The high supply voltage VPP of the invention is varied by the high voltage generator 342 according to whether a negative voltage is applied to the selected wordline Sel.WL. Also, the high supply voltage VPP is varied by the high voltage generator 342 according to whether a negative voltage is applied to the well of the address decoder 320.

Figure 20:
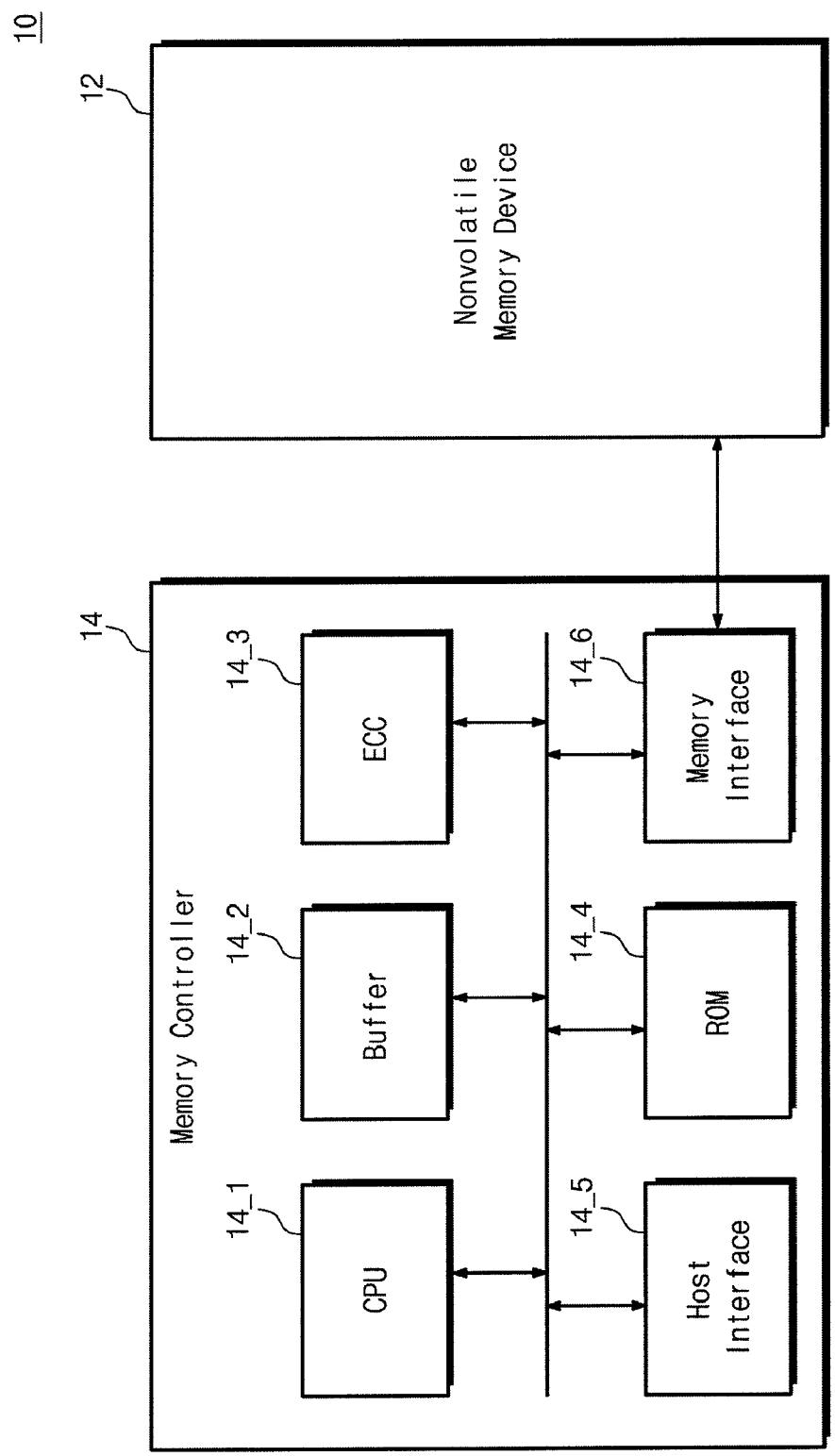
FIG. 20 is a block diagram of a memory system 10 according to an exemplary embodiment of the invention.

FIG. 20 is a block diagram of a memory system according to an exemplary embodiment of the invention.

Referring to FIG. 20, a memory system 10 includes a nonvolatile memory device 12 and a memory controller 14.

The nonvolatile memory device 12 may be configured as the nonvolatile memory device 100 of FIG. 1, the nonvolatile memory device 200 of FIG. 18, or the nonvolatile memory device 300 of FIG. 19. In the nonvolatile memory device 12 the well voltage VWLL and the high supply voltage VPP are varied according to whether a negative voltage is applied to a selected wordline Sel.WL.

The memory controller 14 controls the nonvolatile memory device 12 at the request of an external device (e.g., a host now shown). For example, the memory controller 14 is configured to control each program, read, and erase operation of the nonvolatile memory device 12.

The memory controller 14 provides an interface between the nonvolatile memory device 12 and the host. The memory controller 14 includes a central processing unit (CPU) 14_1, a buffer 14_2, an error correction circuit (ECC) 14_3, a read-only memory (ROM) 14_4, a host interface 14_5, and a memory interface 14_6.

The CPU 14_1 controls the overall operation of the memory controller 14. The central processor (14_1) is configured to execute a firmware code for controlling the nonvolatile memory device 12. The ROM 14_4 stores data, including the executable firmware code used to operate the memory controller 14.

The buffer 14_2 is used as a working memory of the CPU 14_1. At the write request of the host, data received from the host are temporarily stored in the buffer 14_2. Also, at the read request of the host, data read from the nonvolatile memory device 12 are temporarily stored in the buffer 14_2.

At the write request of the host, the error correction circuit (ECC) 14_3 uses an error correction code to decode data stored in the buffer 14_2. Herein, the decoded data and an error correction code value are stored in the nonvolatile memory device 12. At the read request of the host, the ECC 14_3 uses an error correction code value to recover data read from the nonvolatile memory device 12. Herein, the error correction code value is included in the data buffered in the input/output (I/O) circuit 130 of the memory device 12.

The host interface 14_5 includes a protocol for data exchange between the host and the memory controller 14. For example, the memory controller 14 may be configured to communicate with an external device (host) through one of various standardized interface protocols such as Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), external SATA (eSATA), Small Computer Small Interface (SCSI), Enhanced Small Disk Interface (ESDI), and Integrated Drive Electronics (IDE).

The memory interface 14_6 is configured to interface between the nonvolatile memory device 12 and the memory controller 14.

Figure 21:
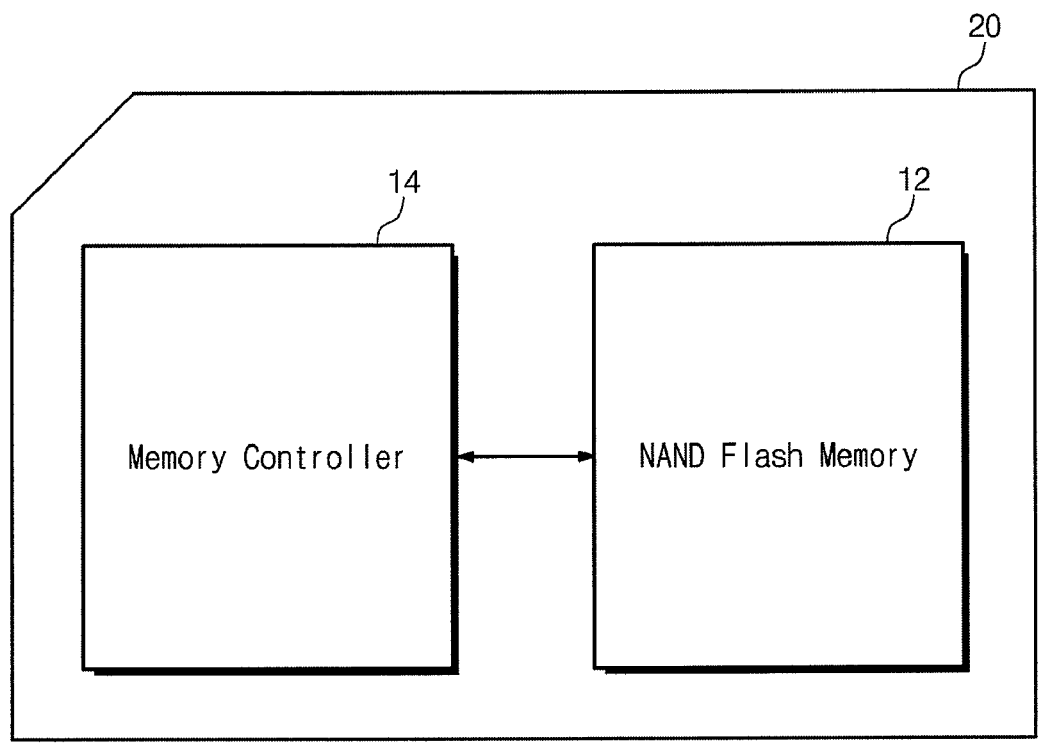
FIG. 21 is a block diagram of a memory card 20 with a nonvolatile memory device according to an exemplary embodiment of the invention.

FIG. 21 is a block diagram of a memory card 20 with a nonvolatile memory device 22 made or operated according to an exemplary embodiment of the invention.

Referring to FIG. 21, a memory card 20 includes a NAND flash memory device 22 and a memory controller 14 controlling the NAND flash memory device 22.

The NAND flash memory device 22 may be configured as the nonvolatile memory device 100 of FIG. 1, the nonvolatile memory device 200 of FIG. 18, or the nonvolatile memory device 300 of FIG. 19. The NAND flash memory device 22 varies the well voltage VWLL and a high supply voltage VPP according to whether a negative voltage is applied to a selected wordline Sel.WL.

The memory controller 24 is connected between a host and the NAND flash memory device 22. The memory controller 24 is configured to access the NAND flash memory device 22 in response to the request of the host.

The memory controller 24 includes a random access memory (RAM), a processing unit, a host interface, and a NAND flash interface. The processing unit of the memory controller 24 is configured to execute a firmware code for controlling the NAND flash memory device 22. The host interface is configured to interface with the host through a standard card (e.g., MMC) protocol for data exchange between the host and the memory controller 24.

The memory card 20 may be implemented as a Multimedia Card (MMC), Secure Digital (SD), miniSD, microSD, Memory Stick, SmartMedia, and TransFlash Card.

Figure 22:
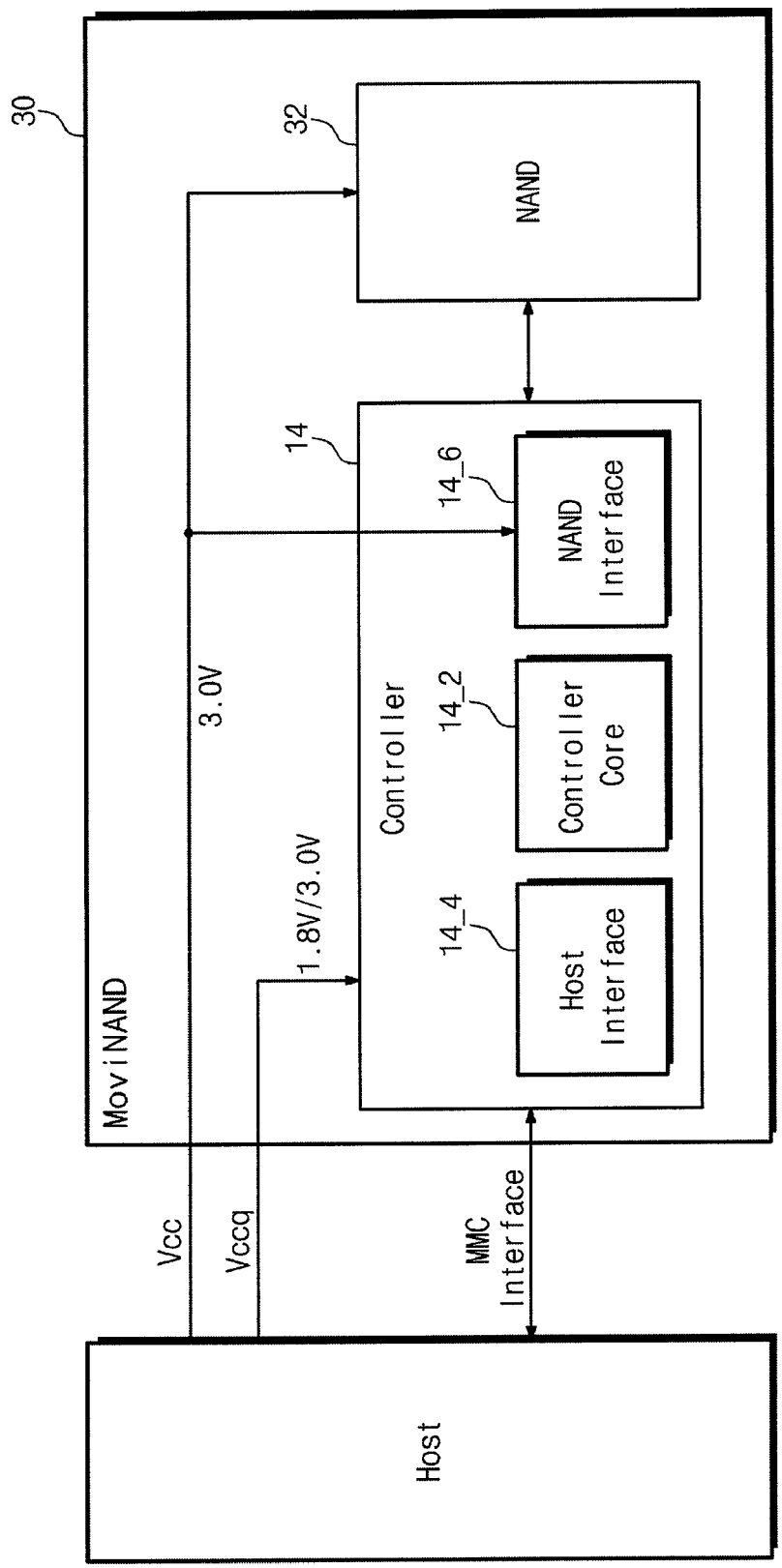
FIG. 22 is a block diagram illustrating a moviNAND device with a nonvolatile memory device according to an exemplary embodiment of the invention.

FIG. 22 is a block diagram illustrating a moviNAND device including a nonvolatile memory device made or operating according to an embodiment of the invention.

Referring to FIG. 22, a moviNAND 30 includes a NAND flash memory device 32 and a flash memory controller 34.

The NAND flash memory device 32 may be implemented using a stack of individually fabricated NAND flash memories formed on different semiconductor chips stacked in one package (e.g., Fine-pitch Ball Grid Array (FBGA)). Each of the unitary NAND flash memories stacked within the NAND flash memory device 32 may be configured as the nonvolatile memory device 100 of FIG. 1, the nonvolatile memory device 200 of FIG. 18, or the nonvolatile memory device 300 of FIG. 19. The NAND flash memory device 32 varies the well voltage VWLL and the high supply voltage VPP according to whether a negative voltage is applied to a selected wordline Sel.WL.

Each of the unitary NAND flash memories in the NAND flash memory device 32 may include a multi-level cell or a single-level memory cell.

The controller 34 includes a controller core processor 34_2, a host interface 34_4 and a NAND interface 34_6. The NAND interface 34_6 is configured to interface between the NAND flash memory device 32 and the controller 34. The host interface 34_4 is configured to interface between the controller 34 and a host.

The moviNAND device 30 receives power supply voltages Vcc and Vccq from the host. The power supply voltage Vcc (about 3V) is supplied to the NAND flash memory device 32 and the NAND interface 34_6, while the power supply voltage Vccq (about 1.8V/3V) is supplied to the controller 34.

Figure 23:
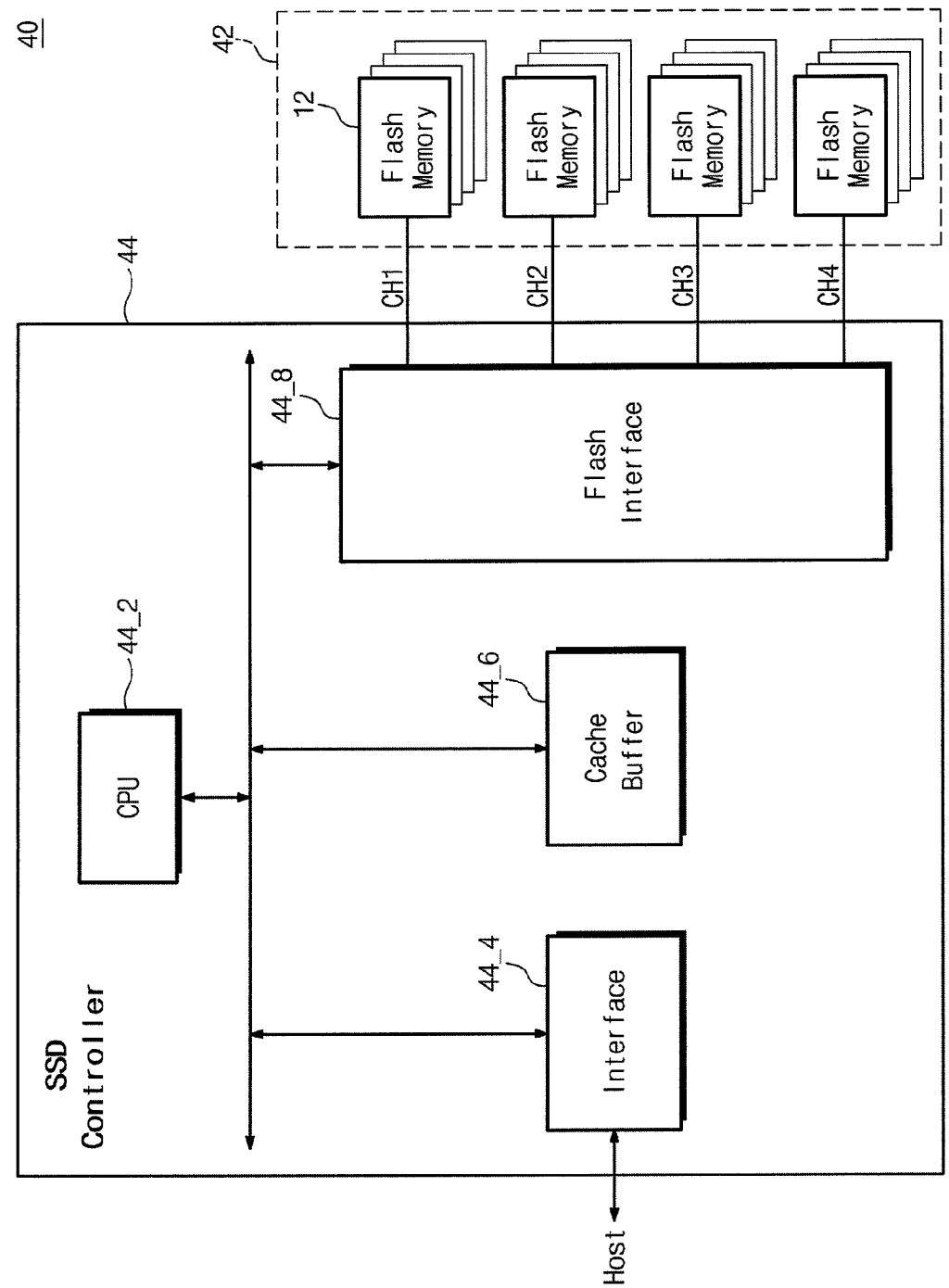
FIG. 23 is a block diagram of an SSD including a memory device according to an exemplary embodiment of the invention.

FIG. 23 is a block diagram of a solid state drive (SSD) according to an exemplary embodiment of the invention.

Referring to FIG. 23, an SSD 40 includes a plurality 42 of flash memory devices 12 and an SSD controller 44.

Each of the flash memory devices 12 may be configured using the nonvolatile memory device 100 of FIG. 1, the nonvolatile memory device 200 of FIG. 18, or the nonvolatile memory device 300 of FIG. 19. Each of the flash memory devices 12 varies the well voltage VWLL and the high supply voltage VPP according to whether a negative voltage is applied to a selected wordline Sel.WL.

The SSD controller 44 includes a central processor (CPU 44_2, an interface 44_4, a cache buffer 44_6, and a flash interface 44_8.

Under the control of the CPU 44_2, the interface 44_4 exchanges data with a host through a standard protocol (e.g. ATA). The interface 44_4 may be one of a Serial Advanced Technology Attachment (SATA) interface, a Parallel Advanced Technology Attachment (PATA) interface, and an External SATA (eSATA) interface.

Data, which will be received/transmitted from/to the host through the interface 44_4, may be transferred through the cache buffer 44_6 without passing through the CPU, under the control of the CPU 44_2.

The cache buffer 44_6 temporarily stores data exchanged between the host and the flash memory devices 12. The cache buffer 44_6 is also used to store executable code that will be executed by the CPU 44_2. The cache buffer 44_6 may be regarded as a buffer memory, and may be configured using an SRAM.

The flash interface 44_8 is configured to interface between the SSD controller 44 and the flash memory devices 12 that are used as data storage devices. The flash interface 44_8 may be configured to support NAND flash memories, One-NAND flash memories, multi-level flash memories, or single-level flash memories in which the high supply voltage VPP is varied according to whether a negative voltage is applied to a selected wordline Sel.WL.

Figure 24:
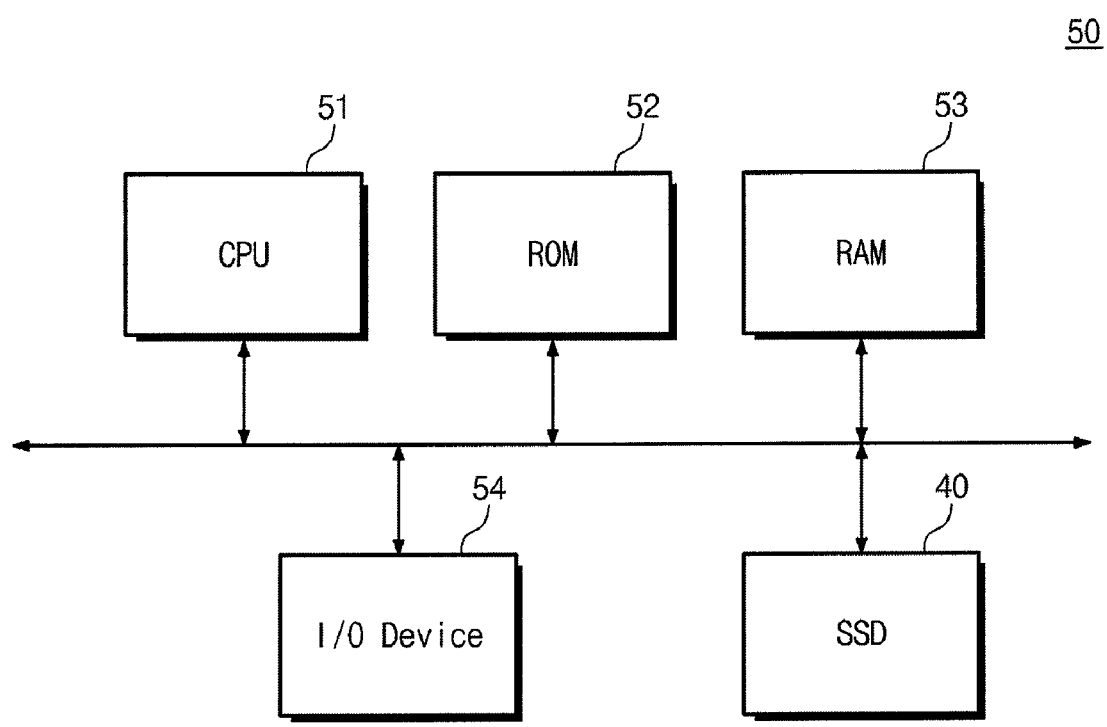
FIG. 24 is a block diagram of a computing system using the SSD 40 of FIG. 23.

FIG. 24 is a block diagram of a computing system according to an exemplary embodiment of the invention.

Referring to FIG. 24, the computing system 50 includes a central processing unit (CPU) 51, a ROM 52, a RAM 53, an input/output (I/O) device 54, and an solid state drive (SSD) 55.

The CPU 51, ROM 52, and the RAM 53, are connected to a system bus. The ROM 52 stores data and executable code used to operate the computing system 50. Herein, the executable code may include a start command sequence or a basic I/O system (BIOS) sequence. The RAM 53 temporarily stores the executable code and any data that are generated by the operation of the CPU 51.

The I/O device 54 is connected through an I/O device interface to the system bus. Examples of the I/O device 54 include keyboards, pointing devices (mouse), monitors, and modems.

The solid state drive SSD 40 is a readable storage device and may be configured the same as the SSD 40 of FIG. 23.

Figure 25:
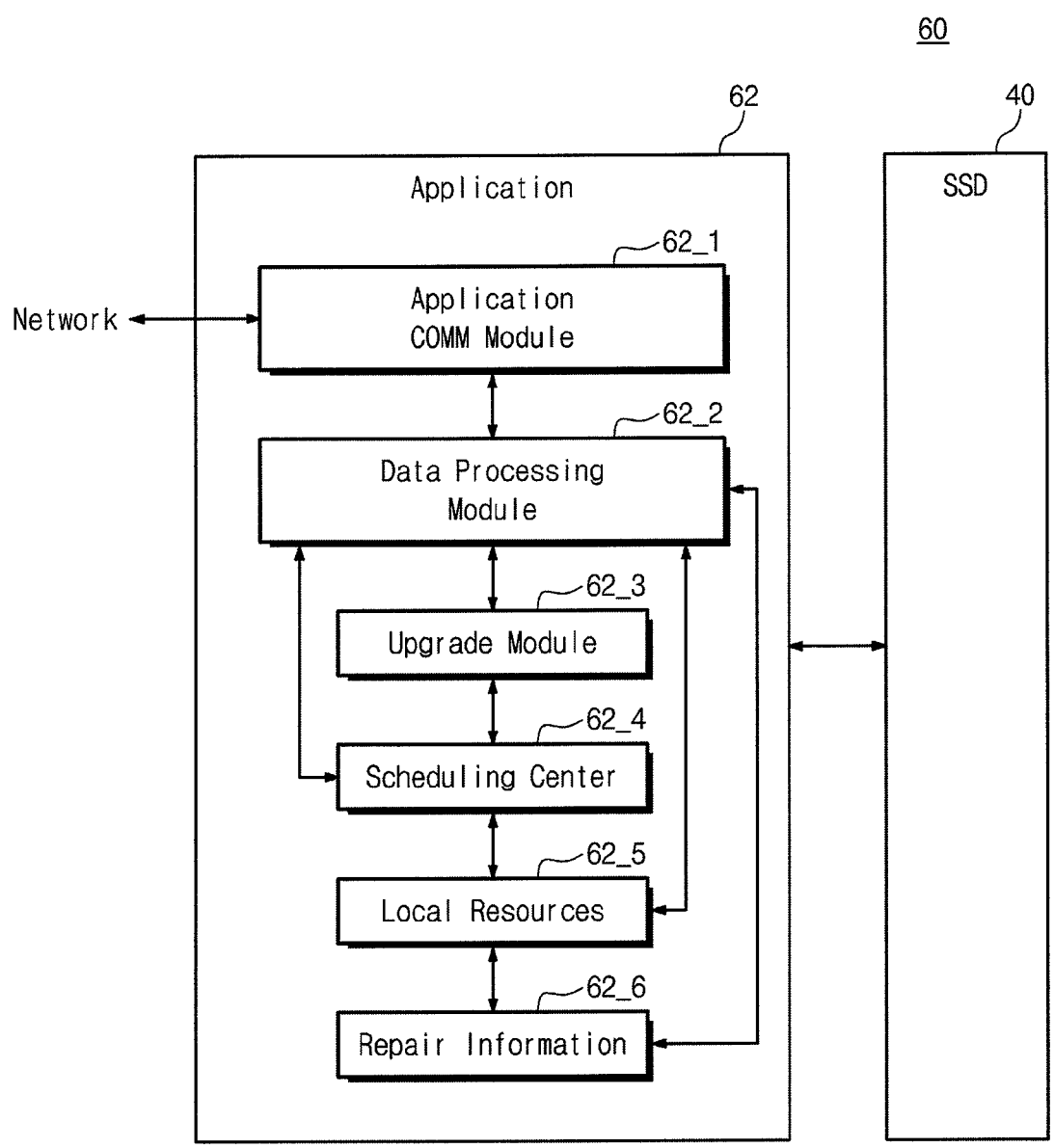
FIG. 25 is a block diagram of a server system using the SSD 40 of FIG. 23.

FIG. 25 is a block diagram of a server system 70 using the SSD 40 of FIG. 23.

Referring to FIG. 25, a server system 60 includes a server 62 and an SSD 40 that stores data. The SSD 40 may be configured the same as the SSD 40 of FIG. 23.

The server 62 includes an application communication module 62_1, a data processing module 62_2, an upgrade module 62_3, a scheduling center 62_4, a local resource module 62_5, and a repair information module 62_6.

The application communication module 62_1 is configured to communicate with a computing system connected through a network to the server 62, or to provide communication between the server 62 and the SSD 40. The application communication module 62_1 transmits information or data, provided through a user interface, to the data processing module 62_2.

The data processing module 62_2 is linked to the local resource module 62_5. Herein, the local resource module 62_5 provides a list of repair shops/dealers/technical information to a user on the basis of information or data inputted to the server 62.

The upgrade module 62_3 interfaces with the data processing module 62_2. On the basis of information or data received from the SSD 40, the upgrade module 62_3 upgrades a firmware, a reset code, a diagnosis system, or other information to electronic appliances.

The scheduling center 62_4 allows real-time options to the user on the basis of information or data inputted to the server 62.

The repair information module 62_6 interfaces with the data processing module 62_2. The repair information module 62_6 is used to provide repair-related information (e.g., audio, video or text files) to the user. The data processing module 62_2 packages related information on the basis of information received from the SSD 40. The packaged information is transmitted to the SSD 40 or is displayed to the user.

Figure 26:
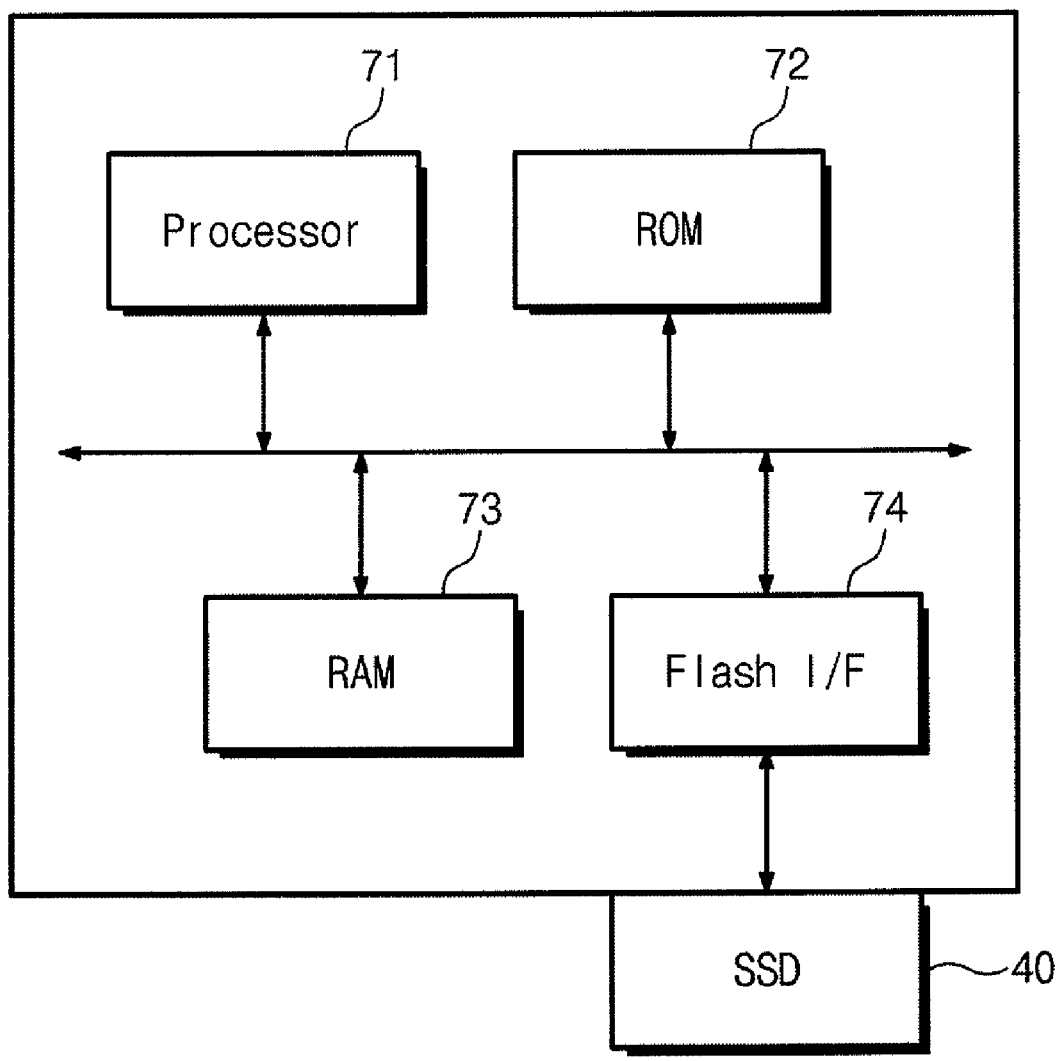
FIG. 26 is a block diagram of an electronic device according to an exemplary embodiment of the invention.

FIG. 26 is a block diagram of an electronic device according to an exemplary embodiment of the invention.

Referring to FIG. 26, an electronic device 70 includes a processor 71, a ROM 72, a RAM 73, a flash interface (I/F) 74, and an SSD 40.

The ROM 72 stores executable code, data, various command sequences such as a start command sequence, or a basic I/O system (BIOS) sequence The processor 71 accesses the RAM 73 to execute firmware codes or other executable codes. Also, the processor 71 accesses the ROM 72 to execute various command sequences such as a start command sequence and a basic I/O system (BIOS) sequence. The flash interface (I/F) 74 is configured to interface between the electronic device 70 and the SSD 40.

The SSD 40 is detachable from the electronic device 70. The SSD 40 may be configured the same as the SSD 40 of FIG. 23.

Examples of the electronic device 70 include cellular phones, personal digital assistants (PDAs), digital cameras, camcorders, portable audio players (e.g., MP3), and portable media players (PMPs).

The memory systems or the storage devices made or operated according to an embodiment of the invention may be mounted in various types of packages. Examples of the packages of the memory system or the storage device according to embodiment of the invention may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the reliability of a nonvolatile memory device made or operated according to an exemplary embodiment of the invention can be improved.

The above-disclosed subject matter is to be considered illustrative and not restrictive, and the appended claims are intended to cover all such modifications, variations, enhancements, and other embodiments, which fall within the true spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A nonvolatile memory device comprising:
a supply voltage generator generating a supply voltage; and
an address decoder, including a first transistor receiving the supply voltage, passing received word line voltages to a plurality of word lines of a selected memory block, wherein the supply voltage varies according to whether a negative word line voltage is passed to at least one of the word lines.

2. The nonvolatile memory device of claim 1, further comprising a well voltage generator generating a well voltage to be applied to the well of the first transistor, wherein the well voltage varies according to whether a negative word line voltage is passed to at least one of the word lines of the selected memory block.

3. The nonvolatile memory device of claim 2, wherein the well voltage has a negative level while a negative word line voltage is passed to at least one of the word lines of the selected memory block.

4. The nonvolatile memory device of claim 2, wherein the address decoder comprises a plurality of memory block selectors, each memory block selector including:
a block word line controlling a memory block selection circuit configured to pass the word line voltages to word lines of a selected memory block;
a pull-up circuit providing the supply voltage to the block word line in response to an enable signal;
a pull-down circuit electrically disconnecting the block word line from the well of the first transistor in response to the enable signal and electrically connecting the block word line to the well of the first transistor in response to a complementary signal of the enable signal.

5. The nonvolatile memory device of claim 2, further comprising: a control logic unit controlling the supply voltage generator and the well voltage generator to vary the supply voltage and the well voltage according to whether a negative voltage is passed to at least one of the word lines of the selected memory block within a program operation, a read operation, a verify read operation, or an erase operation.

6. The nonvolatile memory device of claim 1, wherein the negative word line voltage is passed to a selected word line in a program verify operation for at least one program state.

7. The nonvolatile memory device of claim 6, wherein the negative word line voltage is passed to the selected word line in the program verify operation to verify erased memory cells.

8. The nonvolatile memory device of claim 1, wherein the negative word line voltage is passed to a selected word line in a read operation for at least one program state.

9. A method for driving a nonvolatile memory device, comprising:
generating a supply voltage and applying the supply voltage to a first transistor of a memory block selector in an address decoder;
passing a received word line voltage through the memory block selector to a selected word line selected based on address information; and
varying the supply voltage according to whether the received word line voltage passed to the selected word line is a negative voltage.

10. The method of claim 9, further comprising:
applying a well voltage to the well of the first transistor; and
varying the well voltage according to whether the received word line voltage passed to the selected word line is a negative voltage.

11. The method of claim 10, wherein the supply voltage has a first level and the well voltage has a third level within a program execution period of an incremental step pulse program (ISPP) program loop operation; and
the supply voltage has a second level lower than the first level and the well voltage has a fourth level lower than the third level within a verify read period of the ISPP program loop operation.

12. The method of claim 10, wherein each memory cell in the nonvolatile memory device is programmable to an erase state and a plurality of program states, and wherein a verify read operation is performed at a negative verify level on at least one of the program states; and in each ISPP program loop, the supply voltage and the well voltage respectively have a first level and a third level during a period when the verify read operation is not performed at the negative verify level, and the supply voltage and the well voltage respectively have a second level lower than the first level and a fourth level lower than the third level within a period when the verify read operation is performed at the negative verify level.

13. The method of claim 12, wherein after the verify read operation at the negative verify level passes, a verify read operation at the negative verify level is excluded from the next ISPP program loop.

14. The method of claim 10, wherein the nonvolatile memory device is programmed to an erase state and a plurality of program states, and a verify read operation is performed at a negative verify level on at least one of the program states; and in each ISPP program loop, the supply voltage and the well voltage respectively have a second level and a third level until the verify read operation of the negative verify level passes, and the supply voltage and the well voltage respectively have a first level higher than the first level and a fourth level higher than the third level after the verify read operation of the negative verify level passes.

15. The method of claim 14, wherein after the verify read operation of the negative verify level passes, a verify read operation at the negative verify level is excluded from the next ISPP program loop.

16. The method of claim 10, wherein the supply voltage is varied at different levels and the well voltage is varied at different levels in direct relation to different levels of verify voltages supplied at the selected wordline, wherein at least one of the different levels of verify voltages is negative.

17. The method of claim 16, wherein the supply voltage is set at a first level throughout a program and verify period having more than one negative verify voltage, set at a second level throughout a program and verify period having one negative verify voltage, and set at a third level throughout a program and verify period having no negative verify voltage, the first level being lower than the second level and the second level being lower than the third level.

18. The method of claim 16, wherein the supply voltage and the well voltage are set at a respective first level throughout a program and verify period having more than one negative verify voltage, set at a respective second level throughout a program and verify period having one negative verify voltage, and set at a respective third level throughout a program and verify period having no negative verify voltage, the first level being lower than the second level and the second level being lower than the third level, wherein the different levels of well voltages are negative or ground.

19. An apparatus comprising:
a plurality of memory blocks having a plurality of memory cells formed at the intersections of a plurality of word lines and a plurality of bit lines;
an address decoder selecting one of the memory blocks in response to an input address and passing a word line voltage to a selected word line in the selected memory block corresponding to the input address;
an input/output buffer temporarily storing data to be programmed in the memory cell array in a program operation, or temporarily storing data read from the memory cell array in a read operation;
a voltage generator generating the word line voltage, a supply voltage, and a well voltage;
and a control logic unit controlling the voltage generator to adjust the level of the supply voltage according to the level of the well voltage.

20. The apparatus of claim 19, wherein the control logic unit controls the voltage generator to vary the level of the well voltage according to whether a negative voltage is passed to a word line of the selected memory block.

21. The apparatus of claim 19, wherein the voltage generator includes a negative voltage generator generating the negative voltage.

22. The apparatus of claim 19 further comprising:
a memory controller controlling the nonvolatile memory device, wherein the nonvolatile memory device is controlled to adjust the level of the well voltage applied to the well of the first transistor of the address decoder or the level of the supply voltage supplied to the first transistor according to whether a negative voltage is passed through the address decoder to a selected word line.

23. The apparatus of claim 22, wherein the memory controller includes a host-interface circuit that implements a standardized interface protocol selected from: Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), external SATA (eSATA), Small Computer Small Interface (SCSI), Enhanced Small Disk Interface (ESDI), and Integrated Drive Electronics (IDE).

* * * * *